United States Patent
Nikolic et al.

(10) Patent No.: US 6,553,541 B1
(45) Date of Patent: Apr. 22, 2003

(54) REDUCED-COMPLEXITY SEQUENCE DETECTION

(75) Inventors: Borivoje Nikolic, Berkeley, CA (US); Leo Fu, San Jose, CA (US); Michael Leung, Sunnyvale, CA (US); Vojin G. Oklobdzija, Berkeley, CA (US); Richard Yamasaki, deceased, late of Torrance, CA (US), by Lynn Yamasaki, executrix

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/544,241

(22) Filed: Apr. 5, 2000

Related U.S. Application Data

(60) Provisional application No. 60/129,149, filed on Apr. 14, 1999.

(51) Int. Cl.[7] .......................... H03M 13/41; G11B 20/18
(52) U.S. Cl. ........................................ 714/795; 360/40
(58) Field of Search .............................. 360/40; 714/795

(56) References Cited

U.S. PATENT DOCUMENTS

| | | | | |
|---|---|---|---|---|
| 5,257,272 A | * | 10/1993 | Fredrickson ................. | 360/40 |
| 5,280,489 A | * | 1/1994 | Fredrickson et al. ........ | 714/787 |
| 5,291,499 A | * | 3/1994 | Behrens et al. ............. | 714/796 |
| 5,327,440 A | * | 7/1994 | Fredrickson et al. ........ | 714/795 |
| 5,341,249 A | * | 8/1994 | Abbott et al. ................. | 360/39 |
| 5,485,472 A | * | 1/1996 | Fredrickson ................. | 360/40 |
| 5,588,011 A | * | 12/1996 | Riggle .......................... | 360/46 |
| 5,835,510 A | * | 11/1998 | Hayashi ....................... | 360/39 |
| 6,081,210 A | | 6/2000 | Nikolic et al. ................ | 341/59 |
| 6,154,870 A | * | 11/2000 | Fredrickson et al. ......... | 341/94 |
| 6,313,963 B1 | * | 11/2001 | Hsieh .......................... | 360/46 |
| 6,335,841 B1 | * | 1/2002 | Hirano et al. ................. | 341/50 |
| 6,400,288 B1 | * | 6/2002 | Fredrickson et al. ......... | 341/50 |

* cited by examiner

*Primary Examiner*—Stephen M. Baker
(74) *Attorney, Agent, or Firm*—Carlton H. Hoel; W. James Brady; Frederick J. Telecky, Jr.

(57) ABSTRACT

Reduction of the complexity of a Viterbi-type sequence detector is disclosed. It was based on elimination of less probably taken branches in the trellis. The method is applied to the design of the $E^2PR4$ channel with 8/9 rate sliding block trellis code. Coding, by itself eliminates two states by coding constraints, and the disclosed method reduces the number of required ACS units from 14 to 11, while reducing their complexity as well. For the implementation of $E^2PR4$ detection, 4 4-way, 3 3-way, 3 2-way and one 1-way ACSs are needed. System simulations show no BER performance drop at common SNRs when compared with a full 16-state $E^2PR4$ implementation in magnetic disk drives.

4 Claims, 18 Drawing Sheets

− + − −

− + − +

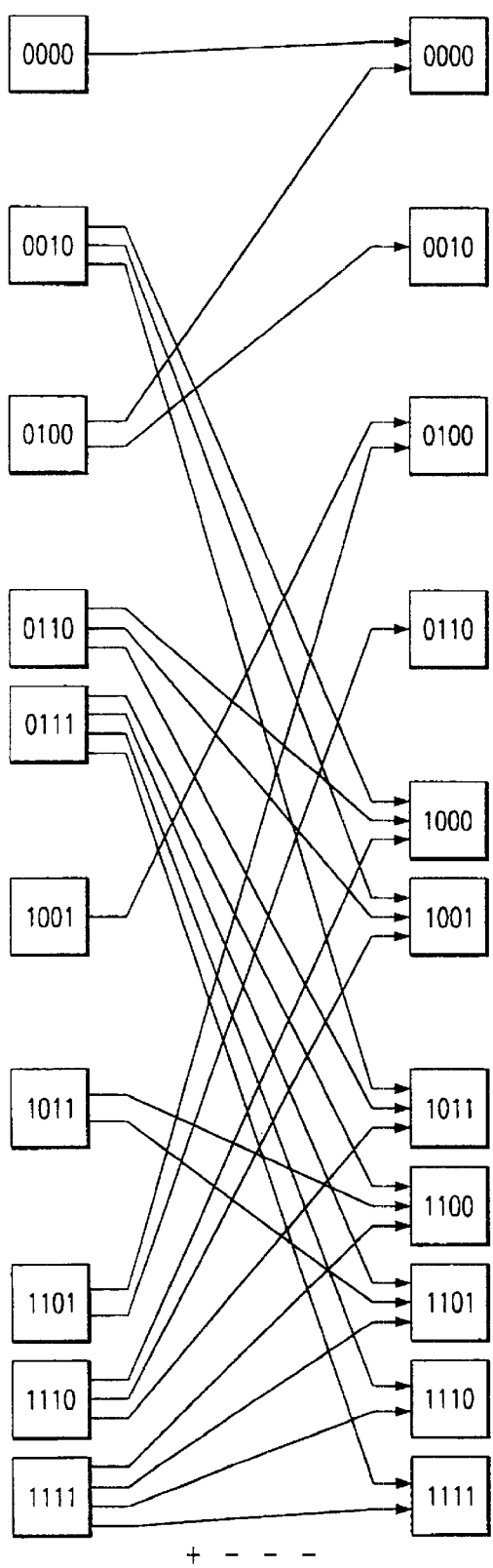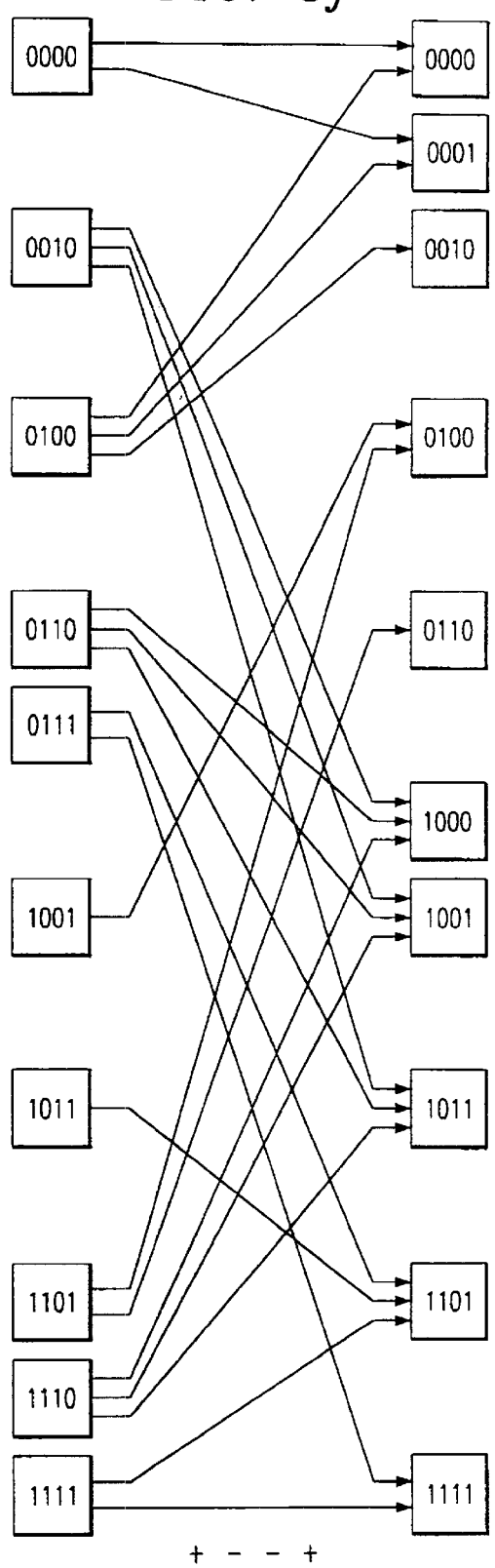

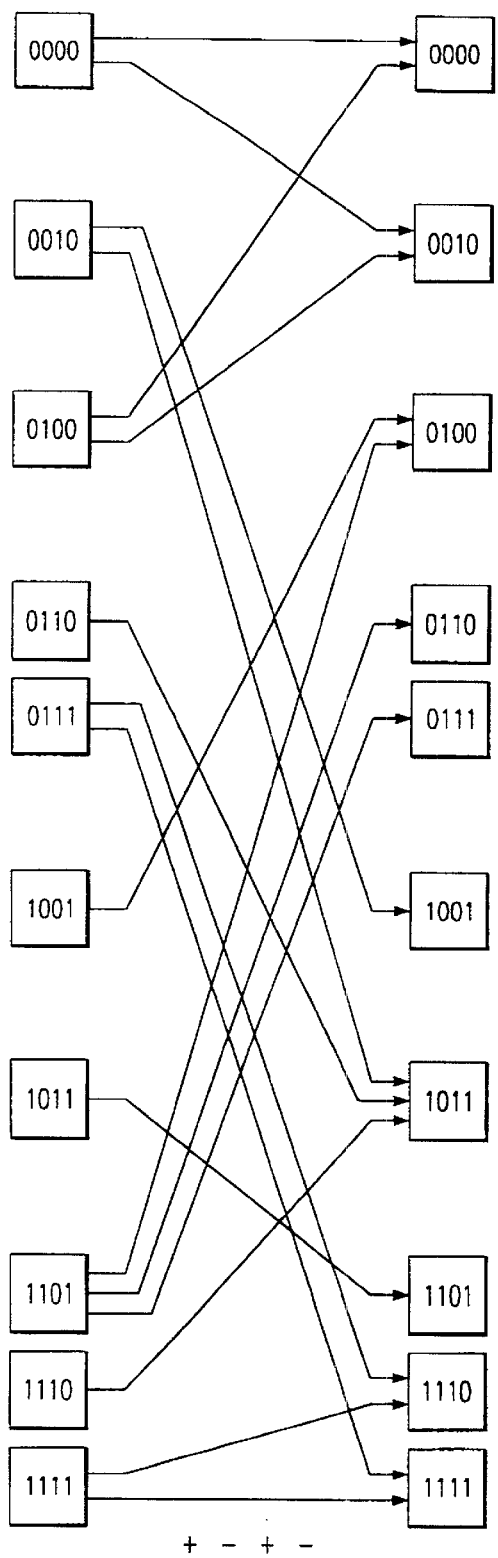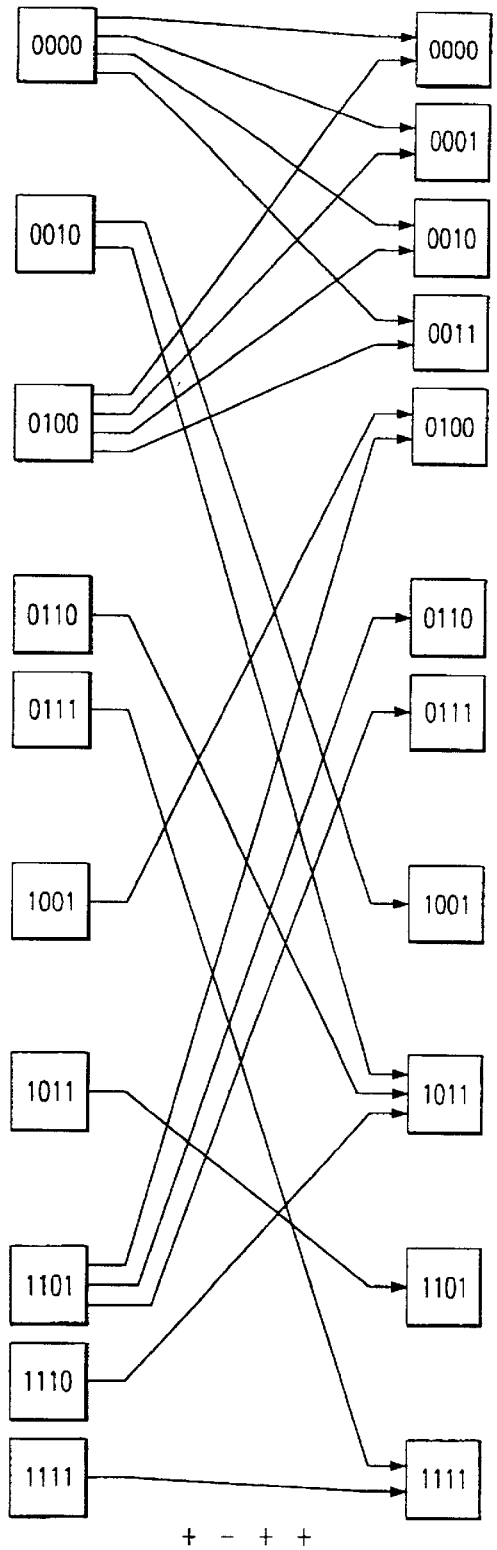

+ + − −

+ + − +

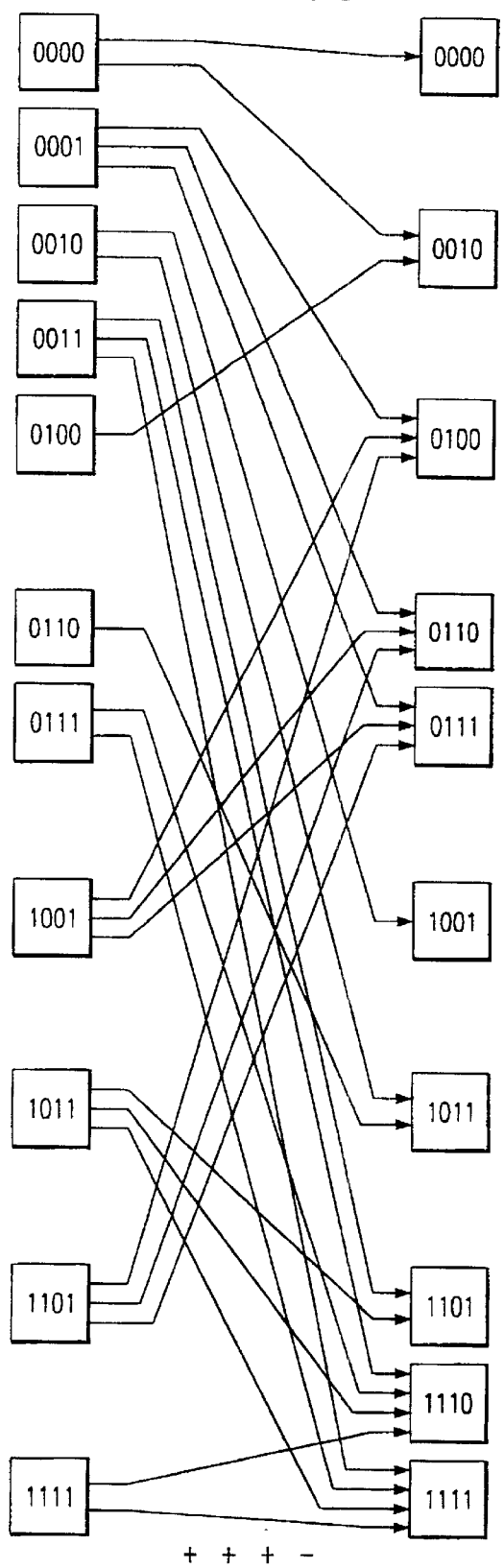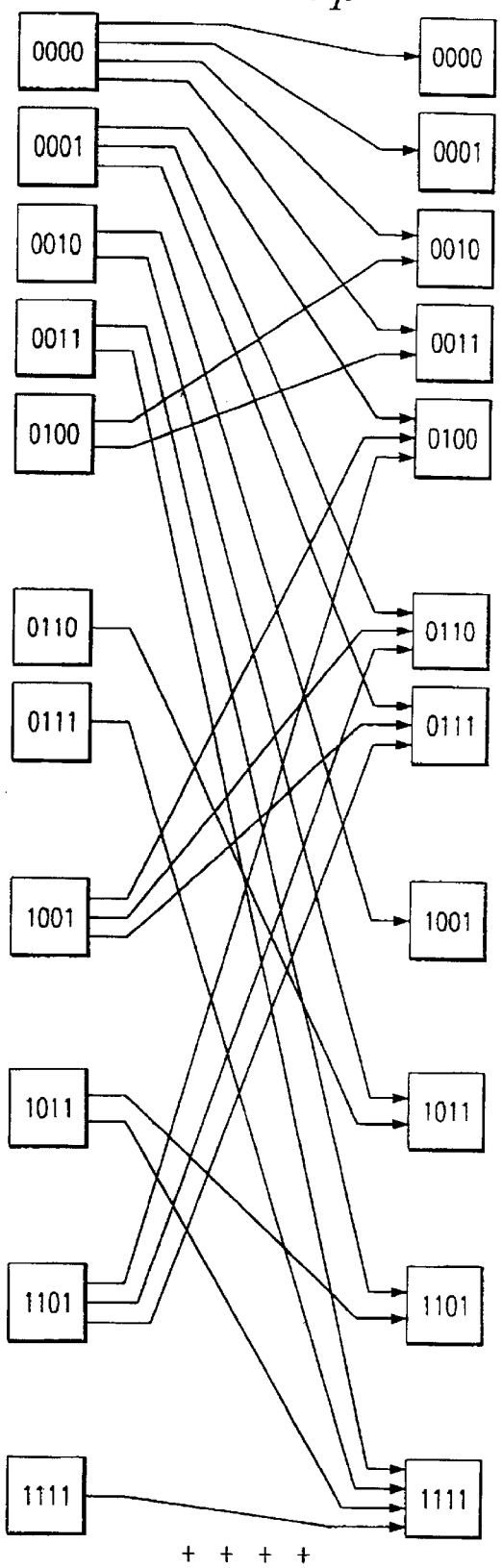

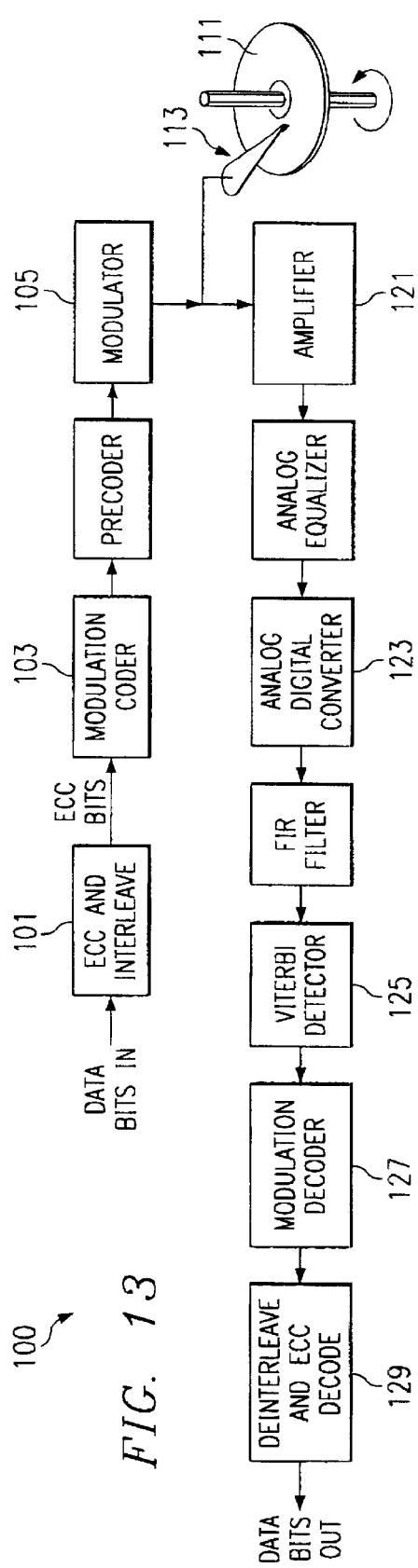
FIG. 13
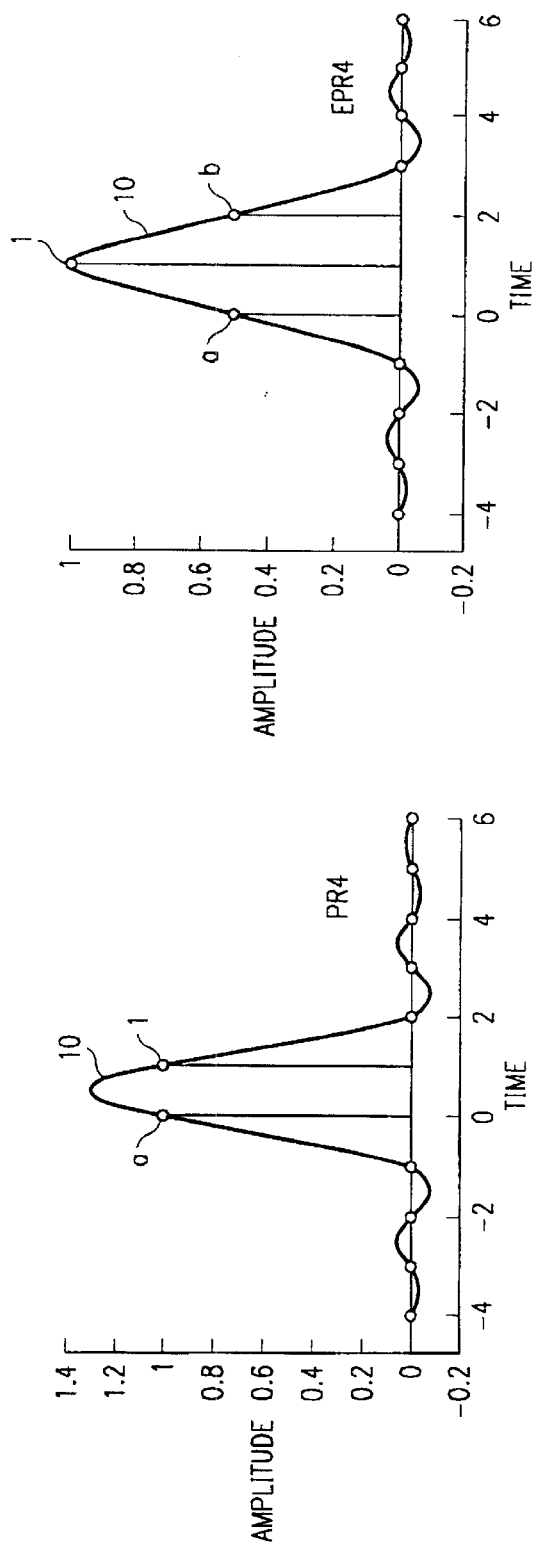
FIG. 14b
FIG. 14a

REDUCED-COMPLEXITY SEQUENCE DETECTION

CROSS-REFERENCE TO RELATED APPLICATIONS

Related subject matter is disclosed in copending U.S. patent application Ser. No. 09/076,717, filed May 13, 1998 and assigned to the assignee of the present application. This application claims the benefit of provisional application Ser. No. 60/129,149 filed on Apr. 14, 1999.

BACKGROUND OF THE INVENTION

The present invention relates to electronic devices, and more particularly to partial response sequence detectors as are useful in magnetic data storage and retrieval.

Magnetic recording and playback systems for digital data storage typically have a functional structure as illustrated in FIG. 13. Such a system operates as follows: for a write of data to storage, data bits first receive error correction encoding (such as Reed-Solomon); this coding aims to correct errors generated in the write-read process and which escape correction by the detection method of the read process. Further, interleaving blocks of error correction encoded bits helps correct bursts of errors by spreading the errors over many blocks. Next, the error correction encoded bits are modulation (channel) coded (such as runlength-limited coding); the modulation coding helps read timing recovery and may eliminate troublesome bit patterns. A further preceding may help intersymbol interference decoding. The modulation coded bits modulate the polarity of the write current in a read/write head over the magnetic media (e.g., a spinning disk) to set the magnetization directions of domains in the magnetic media. The pattern of magnetization directions constitutes the stored data.

The read process reverses the write process. First, the read/write head senses the domain magnetization direction changes by voltages induced through magnetoresistance changes. After amplification the sensed voltages drive clocked analog-to-digital converters and equalizers to yield a stream of digital samples. Noise in the read sensing, amplification, and conversion generates errors in the stream of digital samples. A detector (such as a peak detector or a Viterbi maximum likelihood detector) recovers the modulation encoded bits from the stream of digital samples. The modulation decoder then converts the coded bits to the error correction bits, and lastly, the deinterleaver and error correction decoder corrects errors and recovers the data bits.

For partial response signaling various classes of frequency response for the signal channel prior to detection have been defined; and the class IV response appears particularly suitable for magnetic recording due to pulse shapes requiring minimal equalization. The partial response class IV channel is defined by a channel transfer function polynomial of the form $(1-D)(1+D)^N$ where N is a positive integer and D is a one period delay. FIGS. 14a–14c shows the ideal sensed voltage pulse shapes and sampling times for N=1, 2, and 3; the corresponding pulses are termed PR4, EPR4, and $E^2PR4$ (or EEPR4), respectively. Thus an (E)PR4 sensed voltage consists of a sequence of overlapping (E)PR4 pulses spaced one period apart and with positive, negative, or zero amplitudes depending upon the corresponding transitions of magnetization domain orientations. The sampling of the (E)PR4 sensed voltage yields the digital stream input to the detector, typically a sequence detector such as a maximum likelihood Viterbi decoder. Higher storage densities on a magnetic disk require more samples per induced pulse and consequent more overlap, and thus use the higher order partial response channels. For example, storage densities of about 3 bits per pulse halfwidth would use $E^2PR4$ which has four nonzero samples per pulse; see FIG. 14c. The demand for such high density originates with small, portable devices such as notebook computers.

However, higher order partial response channels require more complex Viterbi detectors because the number of states grows as $2^{N+1}$, and thus the corresponding number of computations and the time required to perform the computations increases rapidly. But high complexity implies high power consumption and slow execution, and this contradicts the requirements of notebook computers and their battery-based power supplies. Hence, there is a demand for low-complexity Viterbi detectors for high order partial response channels.

Maximum likelihood detection of a digital stream with intersymbol interference can be described in terms of maximizing probabilities of paths through a trellis of state transitions (branches). Each state corresponds to a possible pattern of recently received data bits and each stage of the trellis corresponds to a receipt of the next (noisy) input. For example, FIG. 15 illustrates one stage (one sample input) in the trellis for an EPR4 detector; the states are labeled with three previous data bits (reflecting the three sample overlap of pairs of pulses corresponding to isolated data bits) and the branches are labeled with the bit for the transition plus the corresponding scaled noiseless sample input (2, 1, 0, −1, or −2).

FIG. 16 shows a prior art Viterbi detector for EPR4 which includes one add-compare-select (ACS) unit for each trellis state and a branch metric unit for each of the target levels $t_{ij}$; the survival register for each state is in the path memories block. Each branch metric unit computes the square of the difference between its target value and the noisy input sample value. Each ACS stores a metric for its state and has inputs for the appropriate branch metric computations and the related state metrics from other ACS units. At receipt of an input sample signal to the detector, each ACS adds its (two) input branch metric computations to the corresponding state metrics of the states emitting the branches; and then it compares these (two) sums and selects the smaller as the updated state metric for its state. Each state's survival register updates its contents to maintain a survival path for the state; that is, the sequence of selected branches (bits) that have led to the updated state metric. The detected branches will correspond to the path with the smallest metric. At any time the maximum likelihood path through the trellis up to that time is the path traced backwards through the trellis starting from the state with the smallest state metric at that time and recursively using the branch previously selected as the branch into the traced-to state; that is, the survival register contents for the state with the smallest state metric.

The length of the survival registers depends on the modulation code used. As the decision goes deeper into the survival registers, more of the contesting survival paths (versus the correct path) will be eliminated, the detected data will become more accurate.

A straightforward implementation of a Viterbi sequence detector for $E^2PR4$ channel requires 16 state metric units and 7 branch metric computations. This can include an array of 16 single-step or two-step (combining two trellis steps) add-compare-select (ACS) units. In the case of a single-step implementation, the ACS units are two-way (two sums of branch metric plus state metric compared) and in the case of a two-step, they are four-way (four sums of branch metric pairs plus state metric compared). And the two-step has two successive branch metrics computed and input to an ACS unit.

The performance of the Viterbi detector is key to the performance of the whole magnetic read channel. Its increased complexity reduces the speed of the channel, while increasing the power consumed and integrated circuit area occupied.

Several methods have been proposed to reduce the complexity of the Viterbi detector; including both coding constraints and elimination of less probable paths in the trellis. For example, U.S. Pat. No. 5,291,499 chooses a set of error events to be considered and then groups states than can share a single ACS without neglecting the chosen error events. Each ACS compares the sums of branch metrics plus state metrics for all states in the groups and retains only the smallest; that is, only a single one of the states in the group is retained by the ACS. This effectively discards less likely trellis paths.

Another approach limits the target levels considered for samples to the Viterbi detector and thus limits the number of branches to consider. For example, Shaflee and Moon, Low-Complexity Viterbi Detection for a Family of Partial Response Systems, 28 IEEE Tr.Mag. 2892 (1992), only consider. branches for the two adjacent target levels of a sample input to the Viterbi detector. This limits the number of permissible future states and limits computation.

Many codes used in magnetic recording eliminate certain patterns in the code, thus eliminating some trellis states and reducing the complexity of the Viterbi detector. Examples are MFM, or RLL codes with the d constraint equal to 1, such as rate 2/3 (1,7) RLL code. In particular, Vityaev et al, On Viterbi Detector Path Metric Differences, 46 IEEE Tr. Comm. 1549 (1998), describe bounds for path metric differences for EPR4 and $E^2PR4$ channels with d=1 constraint coding. Further, Moision et al, Distance-Enhancing Codes for Digital Recording, 34 IEEE Tr. Mag. 69 (1997), show a rate 8/9 code which eliminates the most common error events by coding constraints.

SUMMARY OF THE INVENTION

The present invention provides low-complexity apparatus and methods for sequential detection by classifying sample levels: this limits branches considered and reduces the number of trellis states which in turn permits a smaller number of smaller ACS units to implement a detector with simple dynamic allocation of the ACS units.

A first preferred embodiment Viterbi detector for an $E^2PR4$ channel uses an 8/9 modulation coding to reduce the two-step trellis to 14 states plus uses sample target levels limited to consideration of only a single level of the opposite sign of the sample. This allows a Viterbi detector implemented with 11 ACS units (4 four-way, 3 three-way, 3 two-way, and 1 one-way) that are dynamically assigned, by simple multiplexing, to the 14 states based on the signs of one prior sample, the current two samples, and one future sample.

Other preferred embodiments provide tradeoffs on the complexity and numbers of ACS units.

BRIEF DESCRIPTION OF THE DRAWINGS

The drawings are heuristic for clarity.

FIG. 13 schematically illustrates a magnetic data storage system.

FIGS. 14a–14c show partial response class IV pulses.

DESCRIPTION OF THE PREFERRED EMBODIMENTS

System and Viterbi Detector Overview

FIG. 13 illustrates a magnetic storage system with an $E^2PR4$ channel and preferred embodiment low complexity Viterbi detector. In particular, writing data bits to storage on magnetic disk 111 proceeds as follows. Error correction coder 101 encodes data bits into error correction coded bits and, optionally, interleaves blocks of coded bits. Modulation (channel) coder 103 codes the output of coder 101 with a constraint to eliminate the states 1010 and 0101 in every other stage of the $E^2PR4$ trellis. An 8/9 code sliding block code as in the cross-referenced application could be used. A precoding may be applied. Then the (precoded) modulation coded bits drive the currents in the read/write head to set the magnetization orientation of domains on spinning magnetic disk 111; this stores the bits.

Figure 14C:
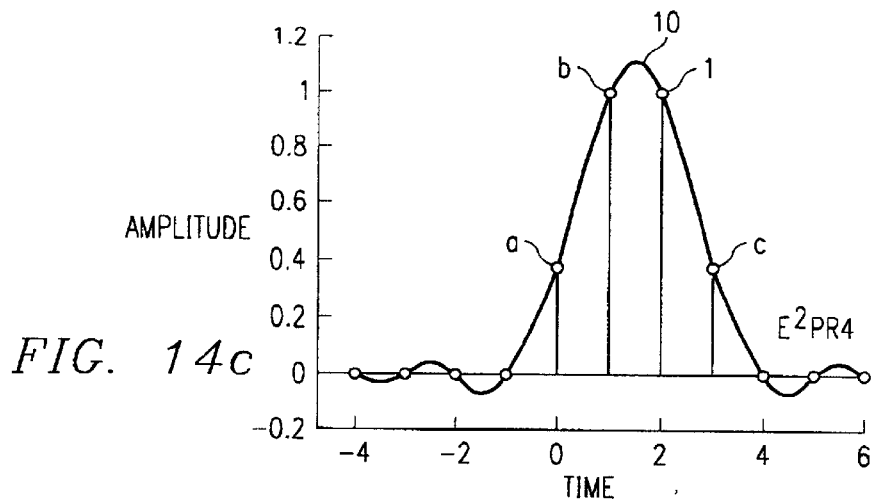
Figure 15:
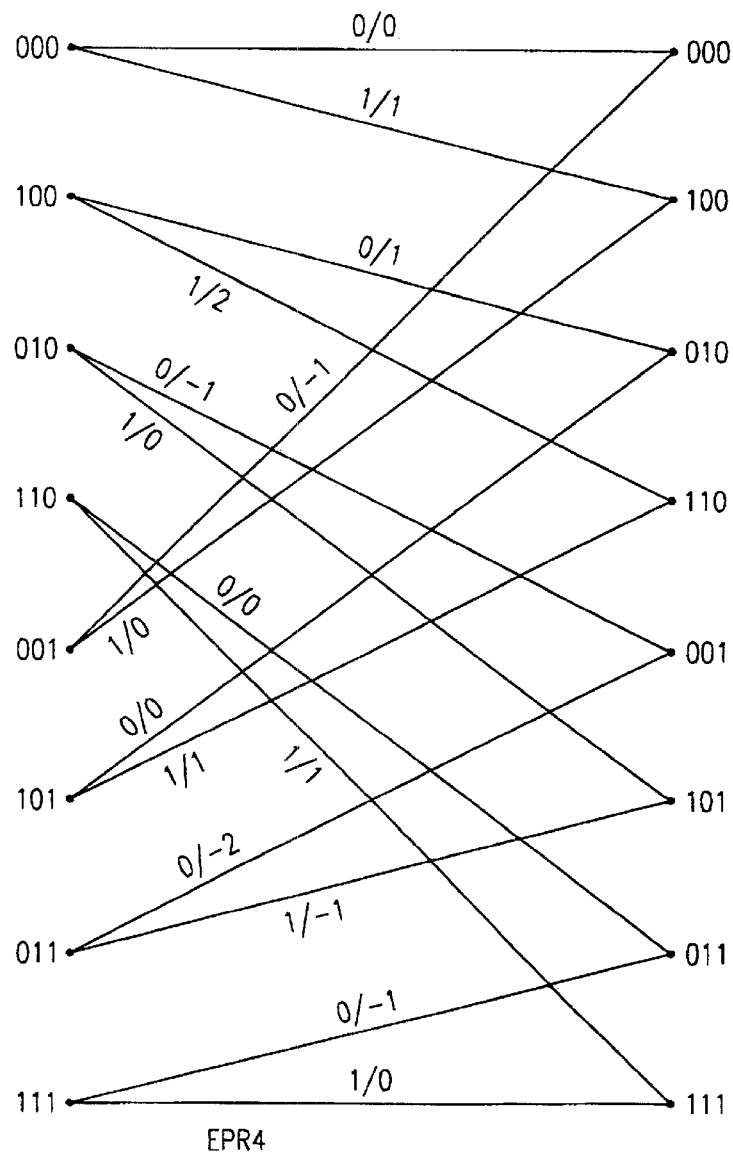
FIG. 15 is a stage of a trellis.

The reading of the stored data bits first amplifies (and filters) with amplifier 121 voltages induced in the read/write head 113 due to the transitions of magnetization orientation of domains on spinning disk 111. The induced voltage signal has the ideal form of a sequence of overlapping pulses, such as illustrated in FIGS. 14a–14c, with positive, negative, or zero amplitudes. The pulse overlaps imply intersymbol interference if the subsequent digital sampling includes contributions from more than one pulse. Clocked analog-to-digital converter 123 samples and quantizes the sequence of pulses to form a digital output stream; there may be 64 or 128 quantization levels (a 6-bit or 7-bit converter with one sign bit and 5 or 6 magnitude bits). Viterbi detector 125 performs a maximum likelihood decoding of the digital output stream.

The maximum likelihood detection corrects some errors in the digital output stream, but other errors remain uncorrected. For modulation codes which include a parity bit, a post processor can detect correlations with dominant error patterns and make corrections if the parity warrants it. Modulation decoder 127 is the inverse of modulation coder 103. Lastly, error correction decoder 129 deinterleaves and further corrects errors and recovers the data bits, hopefully with only minimal errors.

Generically, the preferred embodiments proceed as follows. First, select a modulation code, this may eliminate some trellis states and may require two-step (or higher) trellises. Next, classify input samples by dividing the range of possible sample values into classes (e.g., positive or negative sign) and then eliminate improbable target sample levels (branches) for each class; this eliminates some trellis states at the cost of considering samples on a class-by-class basis. Then pick a set of ACS units to handle the reduced number of trellis states and: provide switching (based on the class definitions) of the ACS units for correct state metric inputs. Lastly, pick branch metric units needed for the ACS units; the number of branch metric units may be reduced by sharing among classes with class-based switching. Further, associating a survival register with an ACS unit minimizes the number of survival registers.

First Preferred Embodiment

The first preferred embodiment low-complexity Viterbi detector for an $E^2PR4$ channel limits the range of target sample levels for positive (negative) input samples to −1, 0, +1, +2, and +3 (−3, −2, −1, 0, and +1) which thereby limits the number of branches in the trellis that need to be considered (i.e., some branches are pruned). Also, the modulation (channel) coding eliminates the 0101 and 1010 states from a two-step trellis, this further reduces the number of states in the two-step trellis when analyzed in view of the signs of the prior sample, the two current samples (for the two-step trellis), and the next sample. In particular, consideration of the sixteen sign combinations of these four samples leads to the possible replacement of 14 four-way ACS units with 4 four-way, 1 three-way, 4 two-way, and 2 one-way (Oust adders) ACS units. However, the control logic to switch the ACS units to cover all of the active states becomes cumbersome; so the preferred embodiments upgrade the ACS units to 4 four-way, 3 three-way, 3 two-way, and 1 one-way permits simple two-bit controlled multiplexing for ACS unit switching.

Trellis Reduction by Coding

Figure 4:
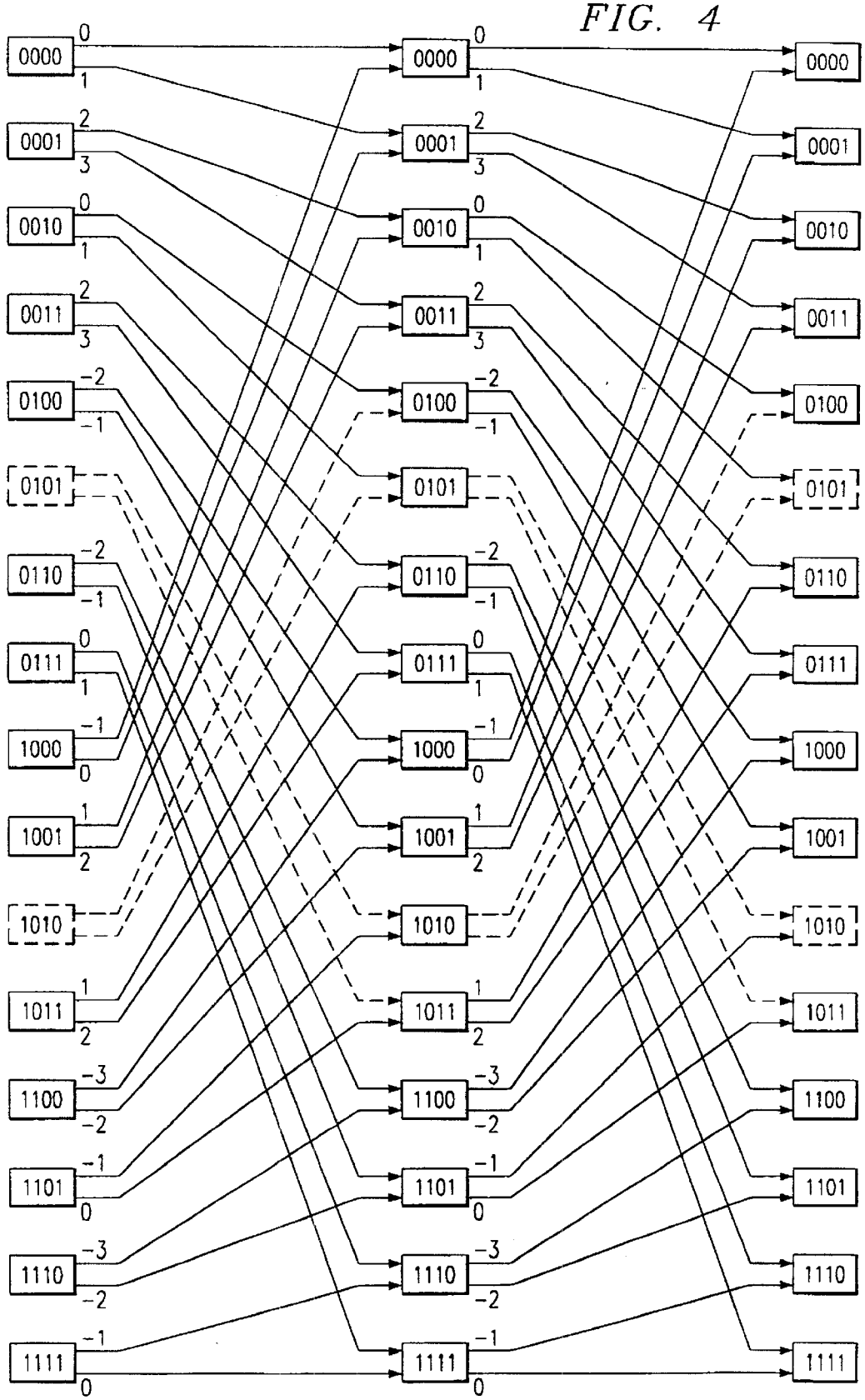
FIG. 4 illustrates a reduced two-stage trellis.

The first preferred embodiment uses an $E^2PR4$ channel with modulation code which eliminates two of the sixteen states of the trellis in every other stage. Indeed, FIG. 4 shows two stages of the $E^2PR4$ trellis with states 0101 and 1010 highlighted and eliminated. The 0101 and 1010 states imply three successive transitions in magnetization direction and thus a 111 (tribit) in NRZI. Elimination of the 0101 and 1010 states prevents such patterns.

Figure 17:
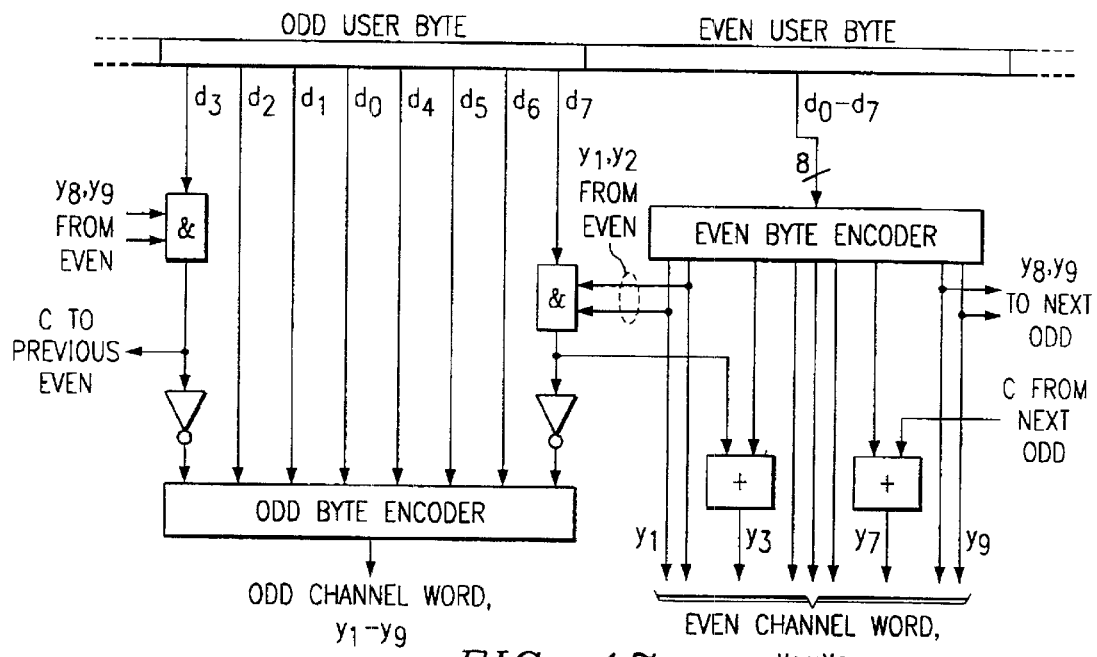
FIG. 17 illustrates an 8/9 coding.

Cross-referenced and incorporated-by-reference application Ser. No. 09/076,717, filed May 13, 1998, discloses a family of 8/9 codes which eliminate the 0101 and 1010 states in every other trellis stage. FIG. 17 illustrates a coder for such an 8/9 code. The preferred embodiment system uses such a modulation code, although any other code which eliminates the 0101 and 1010 states will work in the same manner.

Trellis Reduction by Branch Elimination

Figure 1:
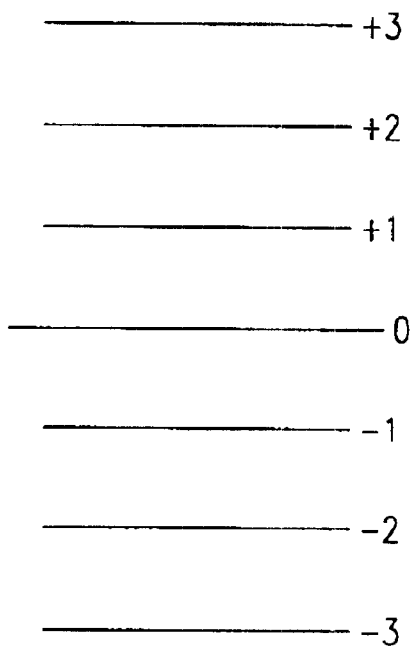
FIGS. 1–3 show target samples levels for $E^2PR4$.
Figure 2:
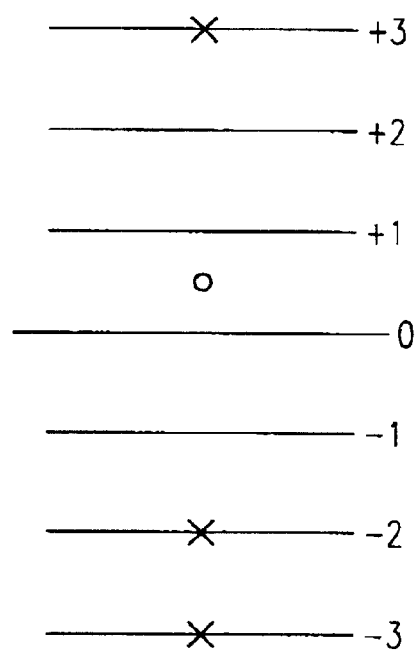

The preferred embodiments further reduce the trellis by imposing limitations on sample target levels considered; that is, the preferred embodiments eliminate (prune) low probability branches. In particular, the $E^2PR4$ target sample levels are shown in FIG. 1. An exemplary input sample is shown in FIG. 2. The shown input sample is most likely caused by the channel input levels +2, +1, 0, −1, and less likely caused by levels +3, −2 and −3. If the same reasoning is applied to all possible signal levels, allowing only four neighboring signals to be causes of observed response; the information can be summarized as shown in Table 1. Other such limitations on sample target levels considered (i.e., trellis branch pruning) can be used, and the preferred embodiments employ simpler limitations in order to reduce complexity in the switching among the ACS units.

TABLE 1

Signal levels that most likely caused the observed sample.

| Input sample | Likely input levels |
| --- | --- |
| s > +3 | +3, +2 |
| +3 > s > +2 | +3, +2, +1 |
| +2 > s > +1 | +3, +2, +1, 0 |
| +1 > s > 0 | +2, +1, 0, −1 |
| 0 > s > −1 | +1, 0, −1, −2 |
| −1 > s > −2 | 0, −1, −2, −3 |
| −2 > s > −3 | −1, −2, −3 |
| −3 > s | −2, −3 |

With the application of a trellis code in the $E^2PR4$ channel, the minimum squared distance between trellis paths for an error event is 10. This corresponds to a single-bit channel-input error event, Ex=[+], or equivalently, Ey=[1 2 0 −2 −1] at the output of the channel. For sample-by-sample threshold detection, the equivalent sample error event for a noiseless sample of value s being sliced into the region [s+2, s+3] or [s−2, s−3] is Ey=[4]. Therefore, for an observed sample of value s, pruning off all trellis branches except those that correspond to [$s_c$+1, $s_c$, $s_f$, $s_f$−1], where $s_c$ and $s_f$ are the ceiling and floor of s, will have little effect on the overall system bit error rate (BER). The effective error distance of pruning off the true branch is 10*log10(1.6)= 2.04 db larger than that of the dominant error event of type Ex=[+]. Moreover, the error distance of common trellis-coded $E^2PR4$ error events, e.g. Ex=[+], [+−], [+0 0 +], will further be degraded by correlation between noise samples. The probability of misdetecting the true signal sequence $S_k$ as another signal sequence $S'_k=S_k+Ey_k$ is:

$$P(Ey_k)=Q(d_k/2\sigma_k) \quad (1)$$

where Q(.) is the error function, $d_k^2=\Sigma Ey_k^2$, and $\sigma_k^2$ is the variance of the noise projected into the error event subspace along the direction of the error event $Ey_k$:

$$\sigma_k^2=(Ey_k,REy_k)/(Ey_k,Ey_k) \quad (2)$$

$Ey_k$ is the vector representation of $Ey_k$ and R is the autocorrelation matrix of the noise at the output of the equalizer. To compare the probability $P(Ey_k)$ for pruning the true branch (Ey=[4]) to various dominant error events in the trellis coded $E^2PR4$ systems, denote $(d_k/\sigma_k)^2$ as the error event signal-to-noise ratio (SNR) for $Ey_k$.

Figure 21:
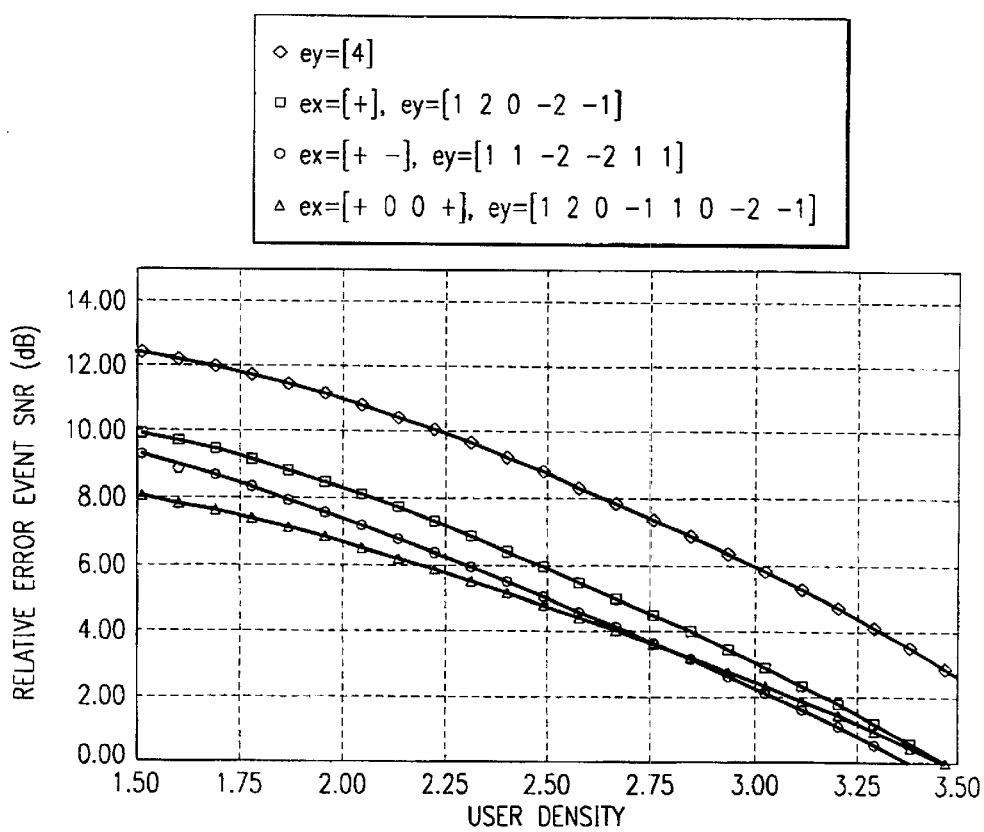
FIG. 21 compares branch pruning and common error events.

FIG. 21 shows the relative error event SNR for Lorentzian pulse with white Gaussian noise. Four error event SNR curves are charted, including the trellis pruning error event, Ey=[4], and the three most dominant error events in trellis coded $E^2PR4$ system. As shown in FIG. 21 the SNR for the pruning error event is at least 3 dB larger than the other dominant error events. It is around 4 dB better than Ex=[+], rather than only 2.04 dB, due to the effect of noise sample correlation. Therefore, the effect of branch pruning on system BER should be insignificant and will be further demonstrated by the simulation results for the practical system.

Figure 3:
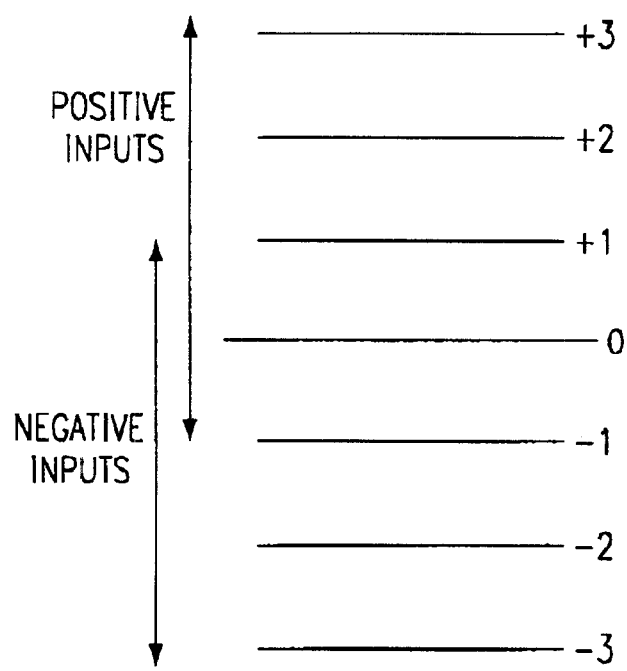

The separation of the eight possible input sample intervals shown in Table 1 for a two-step trellis results in complicated control and selection logic. So, the first preferred embodiments employ a simpler implementation as follows. If the input sample signal level is greater than 0, the allowed input target sample levels are +3, +2, +1, 0, −1. If the input sample level is less than 0, the allowed input target sample levels are +1, 0, −1, −2 , −3, as shown on FIG. 3.

Figure 5A:
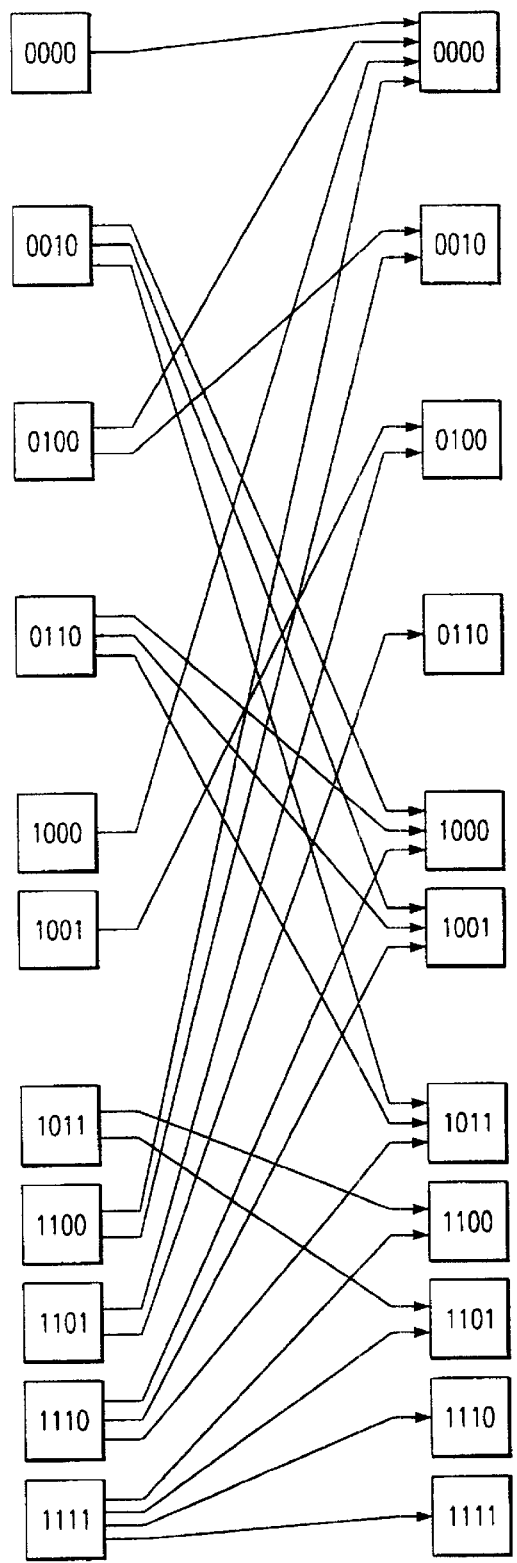
FIG. 5a–5p are preferred embodiment reduced two-stage trellises.

If the less likely branches are eliminated (by using these limitations on considered target levels) from the reduced two-step $E^2PR4$ trellis (shown in FIG. 4), the further reduced trellises shown in FIG. 5a–5p arise according to the signs (positive/negative) of the prior sample, the current two samples for the two-step trellis, and the next sample.

Thus FIGS. 5a–5p show that the preferred embodiment implementation of a Viterbi detector with these reduced trellises requires only the following ACS units, 4 four-way ACS units 1 three-way ACS unit 4 two-way ACS units 2 adders (one-way ACS units)

The states will be dynamically assigned to the ACS units, which will require additional multiplexers in the critical path and some control logic outside the critical path. The following Tables 2–17 show the allocation of ACS units to the states for the sixteen reduced trellises of FIGS. 5a–5p. The four four-way ACS units are labeled ACS4(0)–ACS4(3), the three-way ACS is labeled ACS3(0), the four two-way ACS units labeled ACS2(0)–ACS2(3), and the two adders labeled ADD(0)–ADD(1).

This approach reduces the hardware needed for the implementation of the Viterbi detector by approximately 50–60%. Total number of adders needed is only 29, compared to 64 needed for the full implementation; and the number of comparators is also significantly reduced from 96 to 31.

Note that even without the 8/9 code to eliminate 0101 and 1010 states, the same classification by sign of the prior, current1, current2, and next samples yields sixteen classes analogous to FIGS. 5a–5p but with a maximum of 13 states rather than the 11 states illustrated. This would increase the number of ACS units to 13.

Description of the Minimal ACS Operations

The following Tables 2–17 detail the minimal ACS unit allocation corresponding to FIGS. 5a–5p, respectively. In the tables sm(xxxx) indicates the state metric for state xxxx and bm($t_1,t_2$) means the branch metric for the two successive branches with target sample levels $t_1$ and then $t_2$ for the two samples making up the two-steps in the trellis.

TABLE 2

ACS operations for FIG. 5a trellis with previous sample: −; current two samples: − −; next sample: −

| State | Operation | Unit |
|---|---|---|
| 0000 | sm(0000) + bm(0,0) | ACS4(0) |
|  | sm(0100) + bm(−2,−1) |  |
|  | sm(1000) + bm(−1,0) |  |
|  | sm(1100) + bm(−3,−1) |  |
| 0001 | Term |  |
| 0010 | sm(0100) + bm(−1,1) | ACS2(0) |
|  | sm(1100) + bm(−2,1) |  |
| 0011 | Term |  |
| 0100 | sm(1001) + bm(1,0) | ACS2(0) |
|  | sm(1101) + bm(−1,−1) |  |
| 0101 |  |  |
| 0110 | sm(1101) + bm(0,1) | ADD(0) |
| 0111 | Term |  |
| 1000 | sm(0010) + bm(0,−2) | ACS4(1) |
|  | sm(0110) + bm(−2,−3) |  |
|  | sm(1110) + bm(−3,−3) |  |
| 1001 | sm(0010) + bm(0,−1) | ACS4(2) |
|  | sm(0110) + bm(−2,−2) |  |

TABLE 2-continued

ACS operations for FIG. 5a trellis with previous sample: −; current two samples: − −; next sample: −

| State | Operation | Unit |
|---|---|---|
|  | sm(1110) + bm(−3,−2) |  |
| 1010 |  |  |
| 1011 | sm(0010) + bm(1,1) | ACS3(0) |
|  | sm(0110) + bm(−1,0) |  |
|  | sm(1110) + bm(−2,0) |  |
| 1100 | sm(1011) + bm(1,−2) | ACS2(1) |
|  | sm(1111) + bm(−1,−3) |  |
| 1101 | sm(1011) + bm(1,−1) | ACS2(2) |
|  | sm(1111) + bm(−1,−2) |  |
| 1110 | sm(1111) + bm(0,−1) | ACS4(3) |
| 1111 | sm(1111) + bm(0,0) | ACS2(3) |

TABLE 3

Figure 5B:
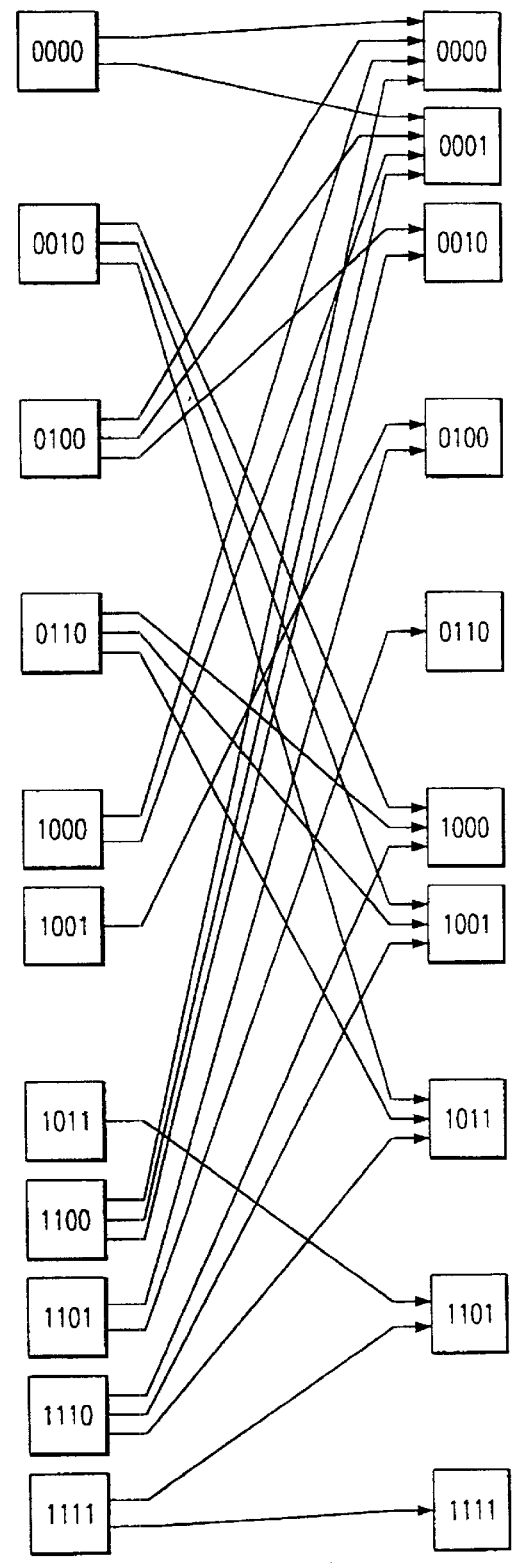

ACS operations for FIG. 5b with previous sample: −; current samples: − −; next sample: +.

| State | Operation | Unit |
|---|---|---|
| 0000 | sm(0000) + bm(0,0) | ACS4(0) |
|  | sm(0100) + bm(−2,−1) |  |
|  | sm(1000) + bm(−1,0) |  |
|  | sm(1100) + bm(−3,−1) |  |
| 0001 | sm(0000) + bm(0,1) | ACS4(1) |
|  | sm(0100) + bm(−2,0) |  |
|  | sm(1000) + bm(−1,1) |  |
|  | sm(1100) + bm(−3,0) |  |
| 0010 | sm(0100) + bm(−1,1) | ACS2(0) |
|  | sm(1100) + bm(−2,1) |  |
| 0011 | Term |  |
| 0100 | sm(1001) + bm(1,0) | ACS2(1) |
|  | sm(1101) + bm(−1,−1) |  |
| 0101 |  |  |
| 0110 | sm(1101) + bm(0,1) | ACS2(2) |
| 0111 | Term |  |
| 1000 | sm(0010) + bm(0,−2) | ACS4(2) |
|  | sm(0110) + bm(−2,−3) |  |
|  | sm(1110) + bm(−3,−3) |  |
| 1001 | sm(0010) + bm(0,−1) | ACS3(0) |
|  | sm(0110) + bm(−2,−2) |  |
|  | sm(1110) + bm(−3,−2) |  |
| 1010 |  |  |
| 1011 | sm(0010) + bm(1,1) | ACS4(3) |
|  | sm(0110) + bm(−1,0) |  |
|  | sm(1110) + bm(−2,0) |  |
| 1100 | Term |  |
| 1101 | sm(1011) + bm(1,−1) | ACS2(3) |
|  | sm(1111) + bm(−1,−2) |  |
| 1110 | Term |  |
| 1111 | sm(1111) + bm(0,0) | [ADD] |

TABLE 4

Figure 5C:
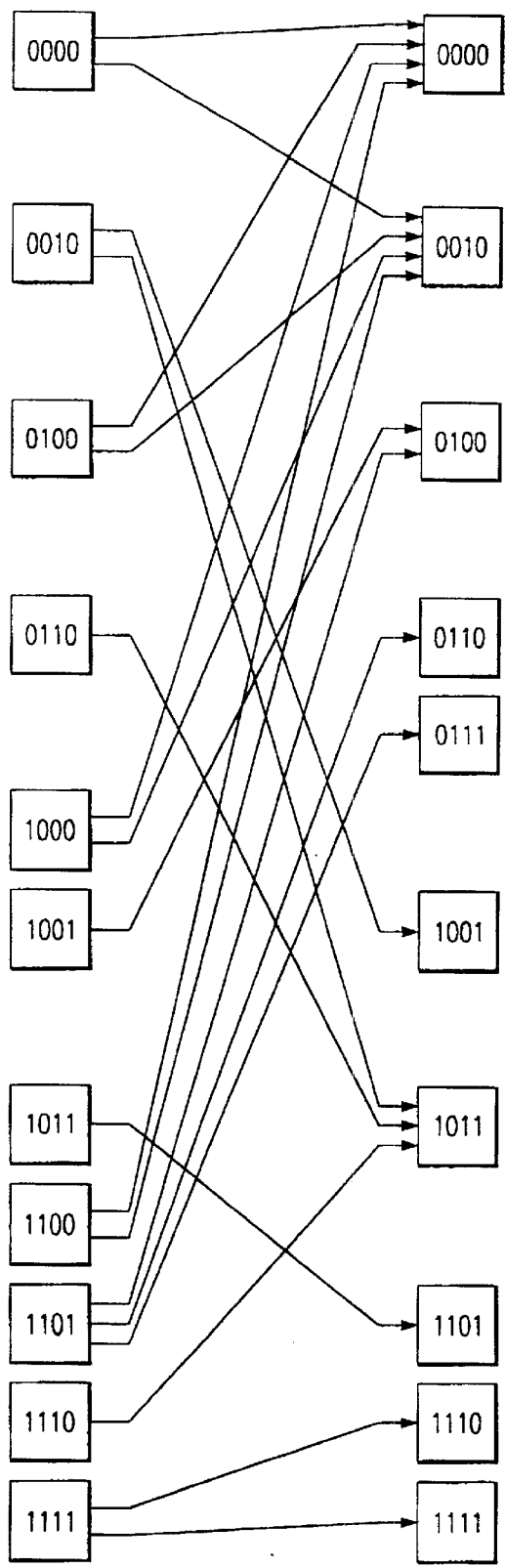

ACS operations for FIG. 5c with previous sample: −; current samples: − +; next sample: −.

| State | Operation | Unit |
|---|---|---|
| 0000 | sm(0000) + bm(0,0) | ACS4(0) |
|  | sm(0100) + bm(−2,−1) |  |
|  | sm(1000) + bm(−1,0) |  |
|  | sm(1100) + bm(−3,−1) |  |
| 0001 | Term |  |
| 0010 | sm(0000) + bm(1,2) | ACS4(1) |
|  | sm(0100) + bm(−1,1) |  |
|  | sm(1000) + bm(0,2) |  |
|  | sm(1100) + bm(−2,1) |  |
| 0011 | Term |  |
| 0100 | sm(1001) + bm(1,0) | ACS2(0) |

TABLE 4-continued

ACS operations for FIG. 5c with previous
sample: −; current samples: − +; next sample: −.

| State | Operation | Unit |
|---|---|---|
| 0101 | sm(1101) + bm(−1,−1) | |
| 0110 | sm(1101) + bm(0,1) | ACS2(1) |
| 0111 | sm(1101) + bm(0,2) | ACS2(2) |
| 1000 | Term | |
| 1001 | sm(0010) + bm(0,−1) | ACS4(2) |
| 1010 | | |
| 1011 | sm(0010) + bm(1,1) | ACS4(3) |
| | sm(0110) + bm(−1,0) | |
| | sm(1110) + bm(−2,0) | |
| 1100 | Term | |
| 1101 | sm(1011) + bm(1,−1) | ACS2(3) |
| 1110 | sm(1111) + bm(0,−1) | ADD(1) |
| 1111 | sm(1111) + bm(0,0) | ADD(2) |

TABLE 5

Figure 5D:
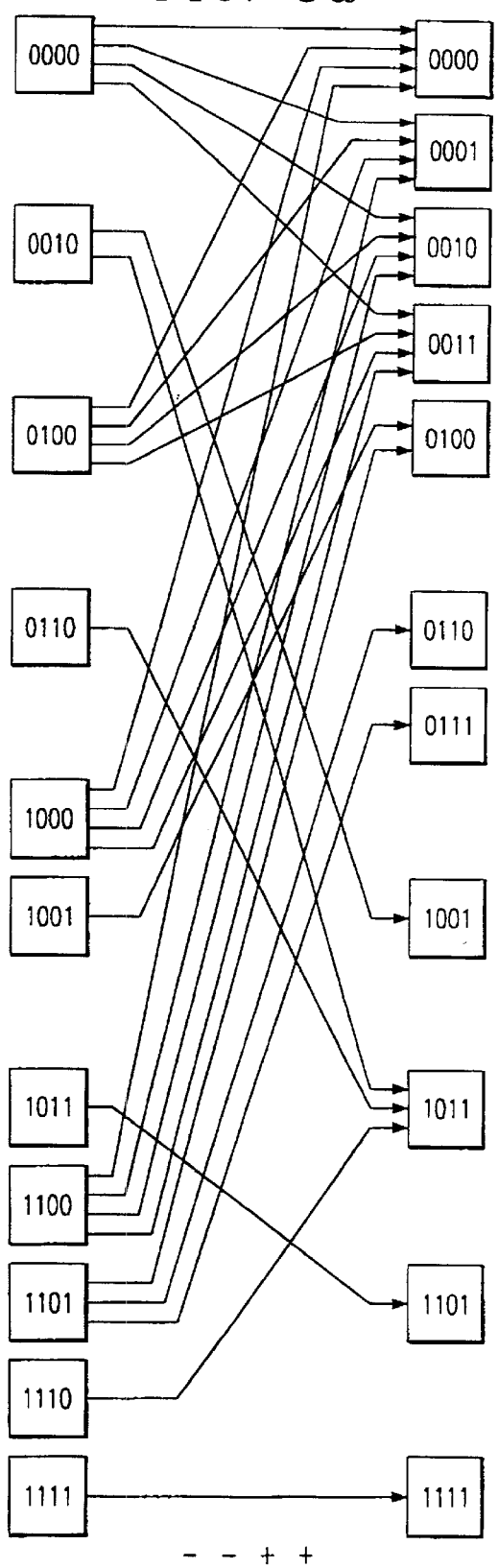

ACS operations for FIG. 5d with previous
sample: −; current samples: − +; next sample: +.

| State | Operation | Unit |
|---|---|---|
| 0000 | sm(0000) + bm(0,0) | ACS4(0) |
| | sm(0100) + bm(−2,−1) | |
| | sm(1000) + bm(−1,0) | |
| | sm(1100) + bm(−3,−1) | |
| 0001 | sm(0000) + bm(0,1) | ACS4(1) |
| | sm(0100) + bm(−2,0) | |
| | sm(1000) + bm(−1,1) | |
| | sm(1100) + bm(−3,0) | |
| 0010 | sm(0000) + bm(1,2) | ACS4(2) |
| | sm(0100) + bm(−1,1) | |
| | sm(1000) + bm(0,2) | |
| | sm(1100) + bm(−2,1) | |
| 0011 | sm(0000) + bm(1,3) | ACS4(3) |
| | sm(0100) + bm(−1,2) | |
| | sm(1000) + bm(0,3) | |
| | sm(1100) + bm(−2,2) | |
| 0100 | sm(1001) + bm(1,0) | ACS2(2) |
| | sm(1101) + bm(−1,−1) | |
| 0101 | | |
| 0110 | sm(1101) + bm(0,1) | ACS2(0) |
| 0111 | sm(1101) + bm(0,2) | ACS2(1) |
| 1000 | Term | |
| 1001 | sm(0010) + bm(0,−1) | ADD(0) |
| 1010 | | |
| 1011 | sm(0010) + bm(1,1) | ACS3(0) |
| | sm(0110) + bm(−1,0) | |
| | sm(1110) + bm(−2,0) | |
| 1100 | Term | |
| 1101 | sm(1011) + bm(1,−1) | ADD(1) |
| 1110 | Term | |
| 1111 | sm(1111) + bm(0,0) | ACS2(3) |

TABLE 6

Figure 5E:
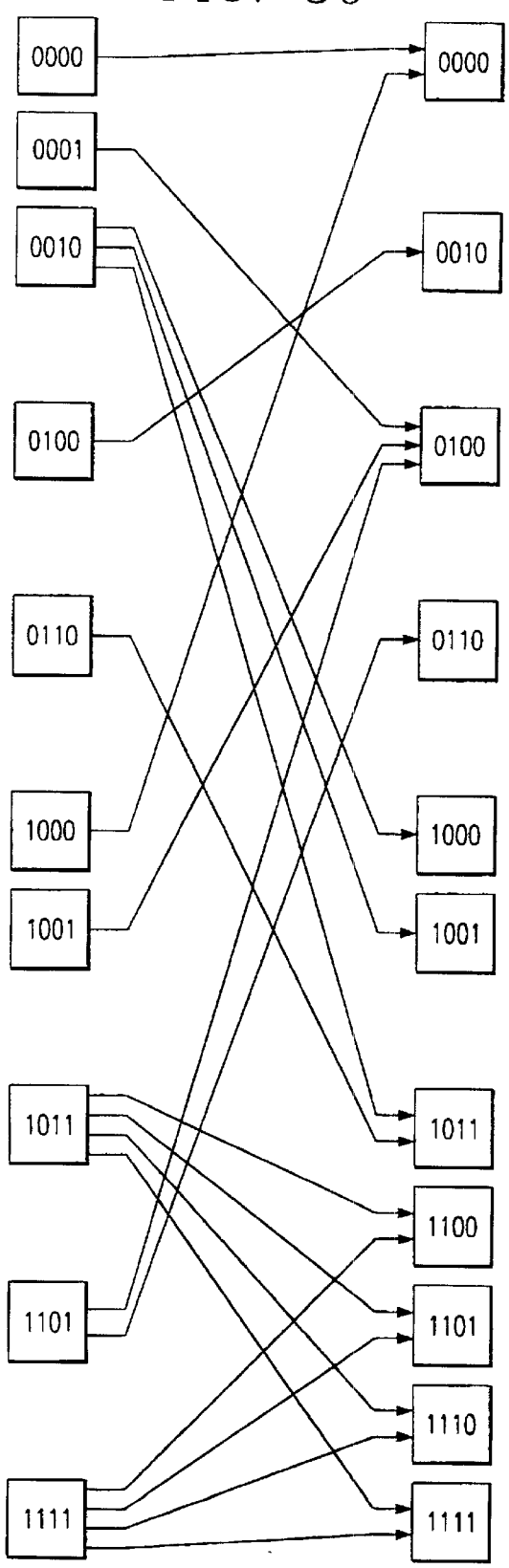

ACS operations for FIG. 5e with previous
sample: −; current samples: + −; next sample: −.

| State | Operation | Unit |
|---|---|---|
| 0000 | sm(0000) + bm(0,0) | ACS4(0) |
| | sm(1000) + bm(−1,0) | |
| 0001 | sm(0001) | FF |
| 0010 | sm(0100) + bm(−1,1) | ACS4(1) |
| 0011 | Term | |
| 0100 | sm(0001) + bm(2,0) | ACS4(2) |
| | sm(1001) + bm(1,0) | |
| | sm(1101) + bm(−1,−1) | |

TABLE 6-continued

ACS operations for FIG. 5e with previous
sample: −; current samples: + −; next sample: −.

| State | Operation | Unit |
|---|---|---|
| 0101 | | |
| 0110 | sm(1101) + bm(0,1) | ADD(0) |
| 0111 | Term | |
| 1000 | sm(0010) + bm(0,−2) | ADD(2) |
| 1001 | sm(0010) + bm(0,−1) | ACS3(0) |
| 1010 | | |
| 1011 | sm(0010) + bm(1,1) | ACS4(3) |
| | sm(0110) + bm(−1,0) | |
| 1100 | sm(1011) + bm(1,−2) | ACS2(0) |
| | sm(1111) + bm(−1,−3) | |
| 1101 | sm(1011) + bm(1,−1) | ACS2(1) |
| | sm(1111) + bm(−1,−2) | |
| 1110 | sm(1011) + bm(2,0) | ACS2(2) |
| | sm(1111) + bm(0,−1) | |
| 1111 | sm(1011) + bm(2,1) | ACS2(3) |
| | sm(1111) + bm(0,0) | |

TABLE 7

Figure 5F:
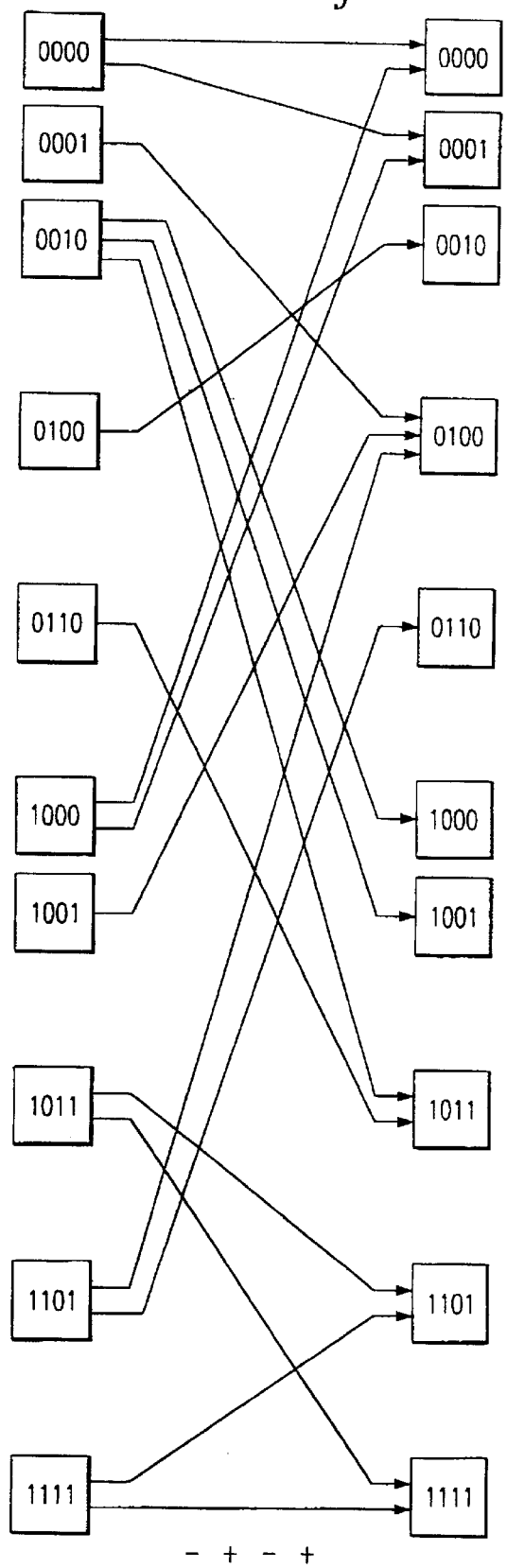

ACS operations for FIG. 5f with previous
sample: −; current samples: + −; next sample: +.

| State | Operation | Unit |
|---|---|---|
| 0000 | sm(0000) + bm(0,0) | ACS4(0) |
| | sm(1000) + bm(−1,0) | |
| 0001 | sm(0000) + bm(0,1) | ACS4(1) |
| | sm(1000) + bm(−1,1) | |
| 0010 | sm(0100) + bm(−1,1) | ACS4(2) |
| 0011 | Term | |
| 0100 | sm(0001) + bm(2,0) | ACS4(3) |
| | sm(1001) + bm(1,0) | |
| | sm(1101) + bm(−1,−1) | |
| 0101 | | |
| 0110 | sm(1101) + bm(0,1) | ACS2(0) |
| 0111 | | |
| 1000 | sm(0010) + bm(0,−2) | ADD(0) |
| 1001 | sm(0010) + bm(0,−1) | ACS3(0) |
| 1010 | | |
| 1011 | sm(0010) + bm(1,1) | ACS2(1) |
| | sm(0110) + bm(−1,0) | |
| 1100 | Term | |
| 1101 | sm(1011) + bm(1,−1) | ACS2(2) |
| | sm(1111) + bm(−1,−2) | |
| 1110 | Term | |
| 1111 | sm(1011) + bm(2,1) | ACS2(3) |
| | sm(1111) + bm(0,0) | |

TABLE 8

Figure 5G:
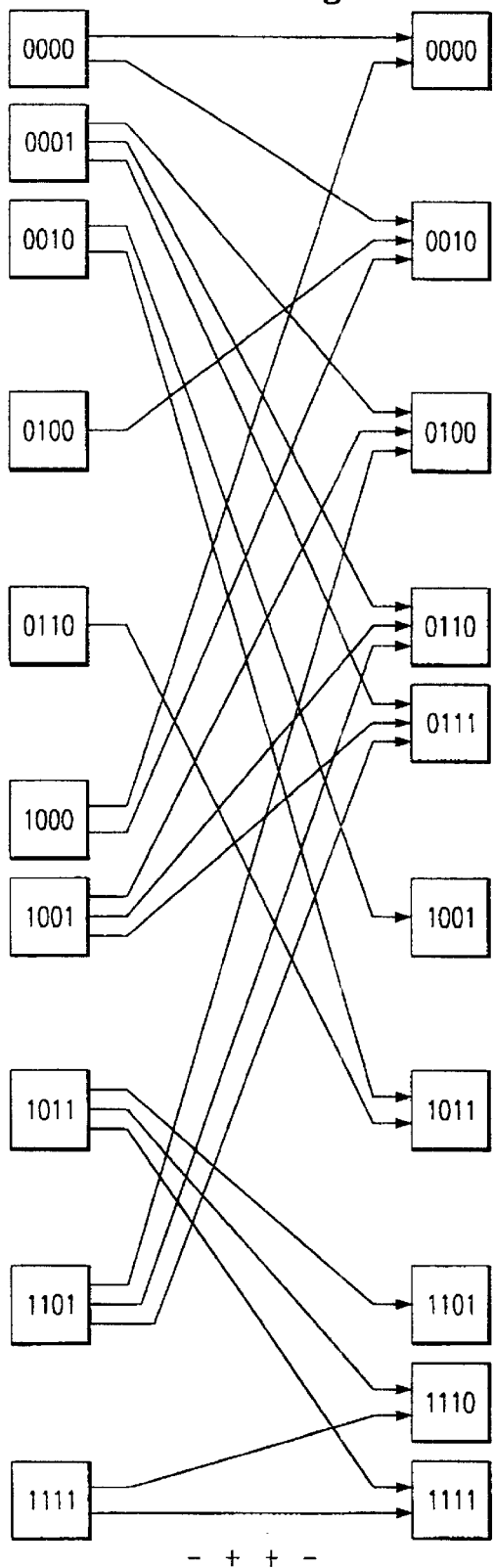

ACS operations for FIG. 5g with previous
sample: −; current samples: + +; next sample: −.

| State | Operation | Unit |
|---|---|---|
| 0000 | sm(0000) + bm(0,0) | ACS2(0) |
| | sm(1000) + bm(−1,0) | |
| 0001 | Term | |
| 0010 | sm(0000) + bm(1,2) | ACS4(1) |
| | sm(0100) + bm(−1,1) | |
| | sm(1000) + bm(0,2) | |
| 0011 | Term | |
| 0100 | sm(0001) + bm(2,0) | ACS4(2) |
| | sm(1001) + bm(1,0) | |
| | sm(1101) + bm(−1,−1) | |
| 0101 | | |
| 0110 | sm(0001) + bm(3,2) | ACS4(0) |
| | sm(1001) + bm(2,2) | |
| | sm(1101) + bm(0,1) | |

TABLE 8-continued

ACS operations for FIG. 5g with previous
sample: −; current samples: + +; next sample: −.

| State | Operation | Unit |
|---|---|---|
| 0111 | sm(0001) + bm(3,3)<br>sm(1001) + bm(2,3)<br>sm(1101) + bm(0,2) | ACS4(3) |
| 1000 | Term | |
| 1001 | sm(0010) + bm(0,−1) | ACS3(0) |
| 1010 | | |
| 1011 | sm(0010) + bm(1,1)<br>sm(0110) + bm(−1,0) | ACS2(1) |
| 1100 | Term | |
| 1101 | sm(1011) + bm(1,−1) | ADD(0) |
| 1110 | sm(1011) + bm(2,0)<br>sm(1111) + bm(0,−1) | ACS2(2) |
| 1111 | sm(1011) + bm(2,1)<br>sm(1111) + bm(0,0) | ACS2(3) |

TABLE 9

Figure 5H:
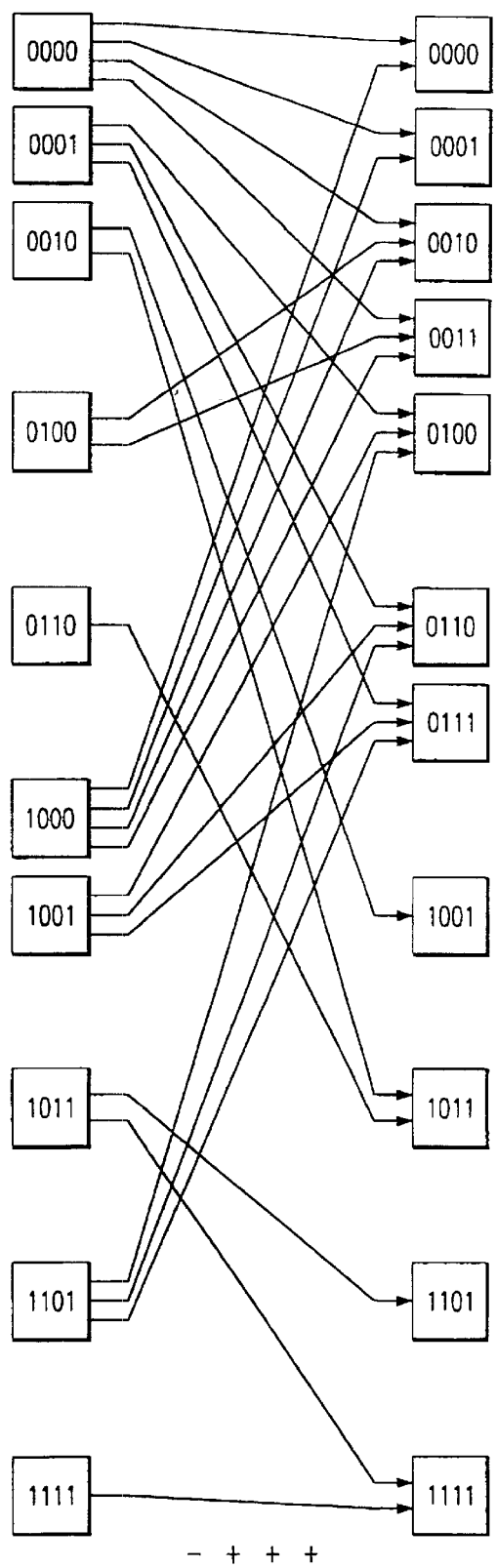

ACS operations for FIG. 5h with previous
sample: −; current samples: + +; next sample: +.

| State | Operation | Unit |
|---|---|---|
| 0000 | sm(0000) + bm(0,0)<br>sm(1000) + bm(−1,0) | ACS2(0) |
| 0001 | sm(0000) + bm(0,1)<br>sm(1000) + bm(−1,1) | ACS2(1) |
| 0010 | sm(0000) + bm(1,2)<br>sm(0100) + bm(−1,1)<br>sm(1000) + bm(0,2) | ACS4(0) |
| 0011 | sm(0000) + bm(1,3)<br>sm(0100) + bm(−1,2)<br>sm(1000) + bm(0,3) | ACS4(1) |
| 0100 | sm(0001) + bm(2,0)<br>sm(1001) + bm(1,0)<br>sm(1101) + bm(−1,−1) | ACS4(2) |
| 0101 | | |
| 0110 | sm(0001) + bm(3,2)<br>sm(1001) + bm(2,2)<br>sm(1101) + bm(0,1) | ACS4(3) |
| 0111 | sm(0001) + bm(3,3)<br>sm(1001) + bm(2,3)<br>sm(1101) + bm(0,2) | ACS3(0) |
| 1000 | Term | |
| 1001 | sm(0010) + bm(0,−1) | ACS2(3) |
| 1010 | | |
| 1011 | sm(0010) + bm(1,1)<br>sm(0110) + bm(−1,0) | ACS2(2) |
| 1100 | Term | |
| 1101 | sm(1011) + bm(1,−1) | ADD(1) |
| 1110 | Term | |
| 1111 | sm(1011) + bm(2,1)<br>sm(1111) + bm(0,0) | ADD(1) |

TABLE 10

ACS operations for FIG. 5i with previous
sample: +; current samples: − −; next sample: −.

| State | Operation | Unit |
|---|---|---|
| 0000 | sm(0000) + bm(0,0)<br>sm(0100) + bm(−2,−1) | ACS2(0) |
| 0001 | Term | |
| 0010 | sm(0100) + bm(−1,1) | ADD(0) |
| 0011 | Term | |
| 0100 | sm(1001) + bm(1,0)<br>sm(1101) + bm(−1,−1) | ACS2(1) |
| 0101 | | |
| 0110 | sm(1101) + bm(0,1) | ADD(1) |
| 0111 | | |
| 1000 | sm(0010) + bm(0,−2)<br>sm(0110) + bm(−2,−3)<br>sm(1110) + bm(−3,−3) | ACS4(0) |
| 1001 | sm(0010) + bm(0,−1)<br>sm(0110) + bm(−2,−2)<br>sm(1110) + bm(−3,−2) | ACS4(1) |
| 1010 | | |
| 1011 | sm(0010) + bm(1,1)<br>sm(0110) + bm(−1,0)<br>sm(1110) + bm(−2,0) | ACS4(2) |
| 1100 | sm(0111) + bm(0,−3)<br>sm(1011) + bm(1,−2)<br>sm(1111) + bm(−1,−3) | ACS4(3) |
| 1101 | sm(0111) + bm(0,−2)<br>sm(1011) + bm(1,−1)<br>sm(1111) + bm(−1,−2) | ACS3(0) |
| 1110 | sm(0111) + bm(1,−1)<br>sm(1111) + bm(0,−1) | ACS2(2) |
| 1111 | sm(0111) + bm(1,0)<br>sm(1111) + bm(0,0) | ACS2(3) |

TABLE 11

ACS operations for FIG. 5j with previous
sample: +; current samples: − −; next sample: +.

| State | Operation | Unit |
|---|---|---|
| 0000 | sm(0000) + bm(0,0)<br>sm(0100) + bm(−2,−1) | ACS2(0) |
| 0001 | sm(0000) + bm(0,1)<br>sm(0100) + bm(−2,0) | ACS2(1) |
| 0010 | sm(0100) + bm(−1,1) | ADD(0) |
| 0011 | Term | |
| 0100 | sm(1001) + bm(1,0)<br>sm(1101) + bm(−1,−1) | ACS2(2) |
| 0101 | | |
| 0110 | sm(1101) + bm(0,1) | ADD(1) |
| 0111 | | |
| 1000 | sm(0010) + bm(0,−2)<br>sm(0110) + bm(−2,−3)<br>sm(1110) + bm(−3,−3) | ACS4(0) |
| 1001 | sm(0010) + bm(0,−1)<br>sm(0110) + bm(−2,−2)<br>sm(1110) + bm(−3,−2) | ACS4(1) |
| 1010 | | |
| 1011 | sm(0010) + bm(1,1)<br>sm(0110) + bm(−1,0)<br>sm(1110) + bm(−2,0) | ACS4(2) |
| 1100 | Term | |
| 1101 | sm(0111) + bm(0,−2)<br>sm(1011) + bm(1,−1)<br>sm(1111) + bm(−1,−2) | ACS4(3) |
| 1110 | Term | |
| 1111 | sm(0111) + bm(1,0)<br>sm(1111) + bm(0,0) | ACS2(3) |

TABLE 12

ACS operations for FIG. 5k with previous
sample: +; current samples: − +; next sample: −

| State | Operation | Unit |
|---|---|---|
| 0000 | sm(0000) + bm(0,0)<br>sm(0100) + bm(−2,−1) | ACS2(0) |
| 0001 | Term | |
| 0010 | sm(0000) + bm(1,2) | ACS2(1) |

TABLE 12-continued

ACS operations for FIG. 5k with previous
sample: +; current samples: − +; next sample: −.

| State | Operation | Unit |
|---|---|---|
|  | sm(0100) + bm(−1,1) |  |
| 0011 | Term |  |
| 0100 | sm(1001) + bm(1,0) | ACS2(2) |
|  | sm(1101) + bm(−1,−1) |  |
| 0101 |  |  |
| 0110 | sm(1101) + bm(0,1) | ADD(0) |
| 0111 | sm(1101) + bm(0,2) | ACS4(0) |
| 1000 | Term |  |
| 1001 | sm(0010) + bm(0,−1) | ACS3(0) |
| 1010 |  |  |
| 1011 | sm(0010) + bm(1,1) | ACS4(1) |
|  | sm(0110) + bm(−1,0) |  |
|  | sm(1110) + bm(−2,0) |  |
| 1100 | Term |  |
| 1101 | sm(1011) + bm(1,−1) | ACS2(3) |
| 1110 | sm(0111) + bm(1,−1) | ACS4(2) |
|  | sm(1111) + bm(0,−1) |  |
| 1111 | sm(0111) + bm(1,0) | ACS4(3) |
|  | sm(1111) + bm(0,0) |  |

TABLE 13

ACS operations for FIG. 5l with previous
sample: +; current samples: − +; next sample: +.

| State | Operation | Unit |
|---|---|---|
| 0000 | sm(0000) + bm(0,0) | ACS2(0) |
|  | sm(0100) + bm(−2,−1) |  |
| 0001 | sm(0000) + bm(0,1) | ACS2(1) |
|  | sm(0100) + bm(−2,0) |  |
| 0010 | sm(0000) + bm(1,2) | ACS2(2) |
|  | sm(0100) + bm(−1,1) |  |
| 0011 | sm(0000) + bm(1,3) | ACS2(3) |
|  | sm(0100) + bm(−1,2) |  |
| 0100 | sm(1001) + bm(1,0) | ACS4(0) |
|  | sm(1101) + bm(−1,−1) |  |
| 0101 |  |  |
| 0110 | sm(1101) + bm(0,1) | ADD(0) |
| 0111 | sm(1101) + bm(0,2) | ADD(1) |
| 1000 | Term |  |
| 1001 | sm(0010) + bm(0,−1) | ACS3(0) |
| 1010 |  |  |
| 1011 | sm(0010) + bm(1,1) | ACS4(1) |
|  | sm(0110) + bm(−1,0) |  |
|  | sm(1110) + bm(−2,0) |  |
| 1100 | Term |  |
| 1101 | sm(1011) + bm(1,−1) | ACS4(2) |
| 1110 | Term |  |
| 1111 | sm(0111) + bm(1,0) | ACS4(3) |
|  | sm(1111) + bm(0,0) |  |

TABLE 14

Figure 5M:
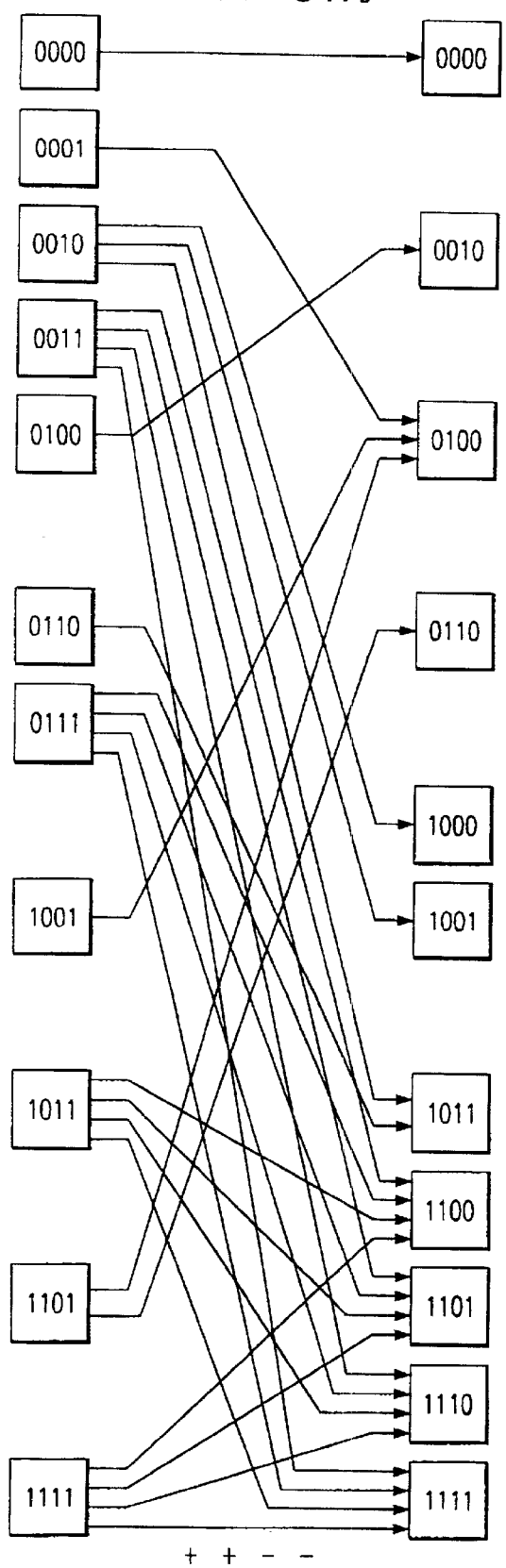

ACS operations for FIG. 5m with previous
sample: +; current samples: + −; next sample: −.

| State | Operation | Unit |
|---|---|---|
| 0000 | sm(0000) + bm(0,0) | ACS2(0) |
| 0001 | Term |  |
| 0010 | sm(0100) + bm(−1,1) | ACS2(1) |
| 0011 | Term |  |
| 0100 | sm(0001) + bm(2,0) | ACS3(0) |
|  | sm(1001) + bm(1,0) |  |
|  | sm(1101) + bm(−1,−1) |  |
| 0101 |  |  |
| 0110 | sm(1101) + bm(0,1) | ADD(0) |
| 0111 | Term |  |

TABLE 14-continued

ACS operations for FIG. 5m with previous
sample: +; current samples: + −; next sample: −.

| State | Operation | Unit |
|---|---|---|
| 1000 | sm(0010) + bm(0,−2) | ADD(1) |
| 1001 | sm(0010) + bm(0,−1) | ACS2(2) |
| 1010 |  |  |
| 1011 | sm(0010) + bm(1,1) | ACS2(3) |
|  | sm(0110) + bm(−1,0) |  |
| 1100 | sm(0011) + bm(2,−2) | ACS4(0) |
|  | sm(0111) + bm(0,−3) |  |
|  | sm(1011) + bm(−1,−2) |  |
|  | sm(1111) + bm(−1,−3) |  |
| 1101 | sm(0011) + bm(2,−1) | ACS4(1) |
|  | sm(0111) + bm(0,−2) |  |
|  | sm(1011) + bm(1,−1) |  |
|  | sm(1111) + bm(−1,−2) |  |
| 1110 | sm(0011) + bm(3,0) | ACS4(2) |
|  | sm(0111) + bm(1,−1) |  |
|  | sm(1011) + bm(2,0) |  |
|  | sm(1111) + bm(0,−1) |  |
| 1111 | sm(0011) + bm(3,1) | ACS4(3) |
|  | sm(0111) + bm(1,0) |  |
|  | sm(1011) + bm(2,1) |  |
|  | sm(1111) + bm(0,0) |  |

TABLE 15

Figure 5N:
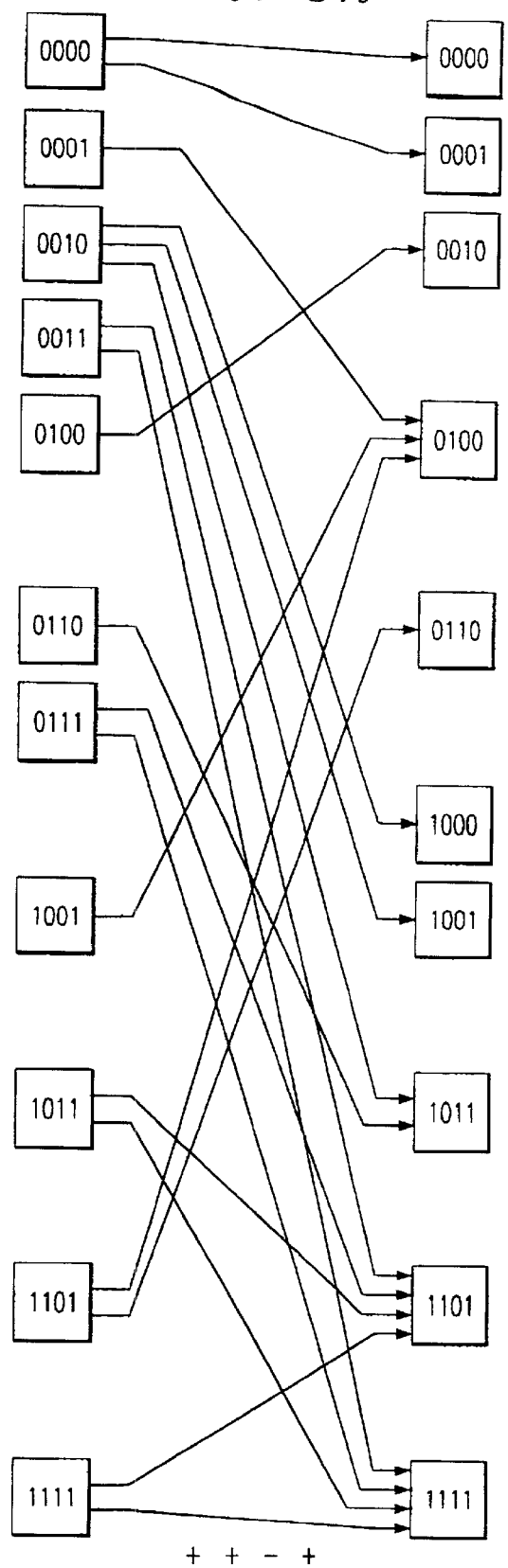

ACS operations for FIG. 5n with previous
sample: +; current samples: + −; next sample: +.

| State | Operation | Unit |
|---|---|---|
| 0000 | sm(0000) + bm(0,0) | ACS2(0) |
| 0001 | sm(0000) + bm(0,1) | ACS2(1) |
| 0010 | sm(0100) + bm(−1,1) | ACS2(2) |
| 0011 | Term |  |
| 0100 | sm(0001) + bm(2,0) | ACS4(0) |
|  | sm(1001) + bm(1,0) |  |
|  | sm(1101) + bm(−1,−1) |  |
| 0101 |  |  |
| 0110 | sm(1101) + bm(0,1) | ADD(0) |
| 0111 | Term |  |
| 1000 | sm(0010) + bm(0,−2) | ADD(1) |
| 1001 | sm(0010) + bm(0,−1) | ACS3(0) |
| 1010 |  |  |
| 1011 | sm(0010) + bm(1,1) | ACS4(1) |
|  | sm(0110) + bm(−1,0) |  |
| 1100 | Term |  |
| 1101 | sm(0011) + bm(2,−1) | ACS4(2) |
|  | sm(0111) + bm(0,−2) |  |
|  | sm(1011) + bm(1,−1) |  |
|  | sm(1111) + bm(−1,−2) |  |
| 1110 | Term |  |
| 1111 | sm(0011) + bm(3,1) | ACS4(3) |
|  | sm(0111) + bm(1,0) |  |
|  | sm(1011) + bm(2,1) |  |
|  | sm(1111) + bm(0,0) |  |

TABLE 16

ACS operations for FIG. 5o with previous
sample: +; current samples: + +; next sample: −.

| State | Operation | Unit |
|---|---|---|
| 0000 | sm(0000) + bm(0,0) | ACS2(0) |
| 0001 | Term |  |
| 0010 | sm(0000) + bm(1,2) | ACS2(1) |
|  | sm(0100) + bm(−1,1) |  |
| 0011 | Term |  |
| 0100 | sm(0001) + bm(2,0) | ACS4(0) |
|  | sm(1001) + bm(1,0) |  |

TABLE 16-continued

ACS operations for FIG. 5o with previous
sample: +; current samples: + +; next sample: −.

| State | Operation | Unit |
|---|---|---|
| 0101 | sm(1101) + bm(−1,−1) | |
| 0110 | sm(0001) + bm(3,2) | ACS4(1) |
|  | sm(1001) + bm(2,2) | |
|  | sm(1101) + bm(0,1) | |
| 0111 | sm(0001) + bm(3,3) | ACS3(0) |
|  | sm(1001) + bm(2,3) | |
|  | sm(1101) + bm(0,2) | |
| 1000 | Term | |
| 1001 | sm(0010) + bm(0,−1) | ACS2(2) |
| 1010 | | |
| 1011 | sm(0010) + bm(1,1) | ACS4(3) |
|  | sm(0110) + bm(−1,0) | |
| 1100 | Term | |
| 1101 | sm(0011) + bm(2,−1) | ACS2(3) |
|  | sm(1011) + bm(1,−1) | |
| 1110 | sm(0011) + bm(3,0) | ACS4(2) |
|  | sm(0111) + bm(1,−1) | |
|  | sm(1011) + bm(2,0) | |
|  | sm(1111) + bm(0,−1) | |
| 1111 | sm(0011) + bm(3,1) | ACS4(3) |
|  | sm(0111) + bm(1,0) | |
|  | sm(1011) + bm(2,1) | |
|  | sm(1111) + bm(0,0) | |

TABLE 17

ACS operations for FIG. 5p with previous
sample: +; current samples: + +; next sample: +.

| State | Operation | Unit |
|---|---|---|
| 0000 | sm(0000) + bm(0,0) | ADD(1) |
| 0001 | sm(0000) + bm(0,1) | ADD(0) |
| 0010 | sm(0000) + bm(1,2) | ACS2(1) |
|  | sm(0100) + bm(−1,1) | |
| 0011 | sm(0000) + bm(1,3) | ACS2(2) |
|  | sm(0100) + bm(−1,2) | |
| 0100 | sm(0001) + bm(2,0) | ACS4(0) |
|  | sm(1001) + bm(1,0) | |
|  | sm(1101) + bm(−1,−1) | |
| 0101 | | |
| 0110 | sm(0001) + bm(3,2) | ACS4(1) |
|  | sm(1001) + bm(2,2) | |
|  | sm(1101) + bm(0,1) | |
| 0111 | sm(0001) + bm(3,3) | ACS4(2) |
|  | sm(1001) + bm(2,3) | |
|  | sm(1101) + bm(0,2) | |
| 1000 | Term | |

TABLE 17-continued

ACS operations for FIG. 5p with previous
sample: +; current samples: + +; next sample: +.

| State | Operation | Unit |
|---|---|---|
| 1001 | sm(0010) + bm(0,−1) | ACS3(0) |
| 1010 | | |
| 1011 | sm(0010) + bm(1,1) | ACS2(0) |
|  | sm(0110) + bm(−1,0) | |
| 1100 | Term | |
| 1101 | sm(0011) + bm(2,−1) | ACS2(3) |
|  | sm(1011) + bm(1,−1) | |
| 1110 | Term | |
| 1111 | sm(0011) + bm(3,1) | ACS4(3) |
|  | sm(0111) + bm(1,0) | |
|  | sm(1011) + bm(2,1) | |
|  | sm(1111) + bm(0,0) | |

The ACS Assignment Problem

The 11 resources used in Tables 2–17 must be shared by the 14 states through dynamical assignment to states in each two-step time interval. Detailed analysis of the branch metrics calculations and ACS usage leads to a second architecture with simplified ACS assignments as described in the following ACS units assignment section. But first consider the branch metric units.

Branch Metrics Units Assignment

The calculation of branch metrics is done in branch metrics units, which calculate the distance between the input sample and the seven possible equalized E2PR4 target sample levels. For the two-step trellis implementation the branch metrics are calculated by using the two current samples, x and x' with target sample levels of t1 and t2.

$$bm=\|x-t_1\|+\|x'-t_2\|$$

Figure 6:
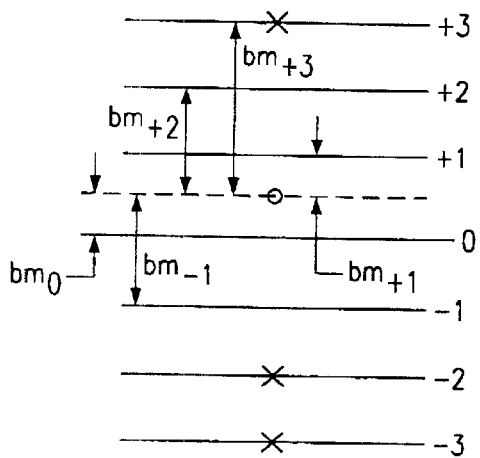
FIG. 6 show branch metric computations.

In single-step E2PR4 implementation, there are seven possible branch metrics to be calculated. In case of a two-step implementation, 39 different metrics have to be calculated. However, the preferred embodiment trellis reduction implies that not all of the branch metrics are required to be calculated in every step. FIG. 6 shows an exemplary input sample and the five branch metrics that are calculated in the preferred embodiment reduced complexity approach. Indeed, FIGS. 5a–5p show that only the branch metrics listed in Table 18 need to be calculated.

TABLE 18

Branch metrics calculated for different
sequences of inputs, are labeled with o.

Sign of input samples, previous, current two, and next

|  | −−−− | −−−+ | −−+− | −−++ | −+−− | −+−+ | −++− | −+++ | +−−− | +−−+ | +−+− | +−++ | ++−− | ++−+ | +++− | ++++ |
|---|---|---|---|---|---|---|---|---|---|---|---|---|---|---|---|---|
| −3, −3 | o | o | | | | | | | o | o | | | | | | |
| −3, −2 | o | o | | | | | | | o | o | | | | | | |
| −3, −1 | o | o | o | o | | | | | | | | | | | | |
| −3, 0 | | o | | o | | | | | | | | | | | | |
| −2, −3 | o | o | | | | | | | o | | | | | | | |
| −2, −2 | o | o | o | | | | | | o | | | | | | | |
| −2, −1 | o | o | o | o | | | | | o | o | o | o | | | | |
| −2, 0 | o | o | o | o | | | | | o | o | o | o | | | | |
| −2, 1 | o | | o | o | | | | | | | | | | | | |
| −2, 2 | | | | o | | | | | | | | | | | | |

TABLE 18-continued

Branch metrics calculated for different sequences of inputs, are labeled with o.

Sign of input samples, previous, current two, and next

| | ---- | ---+ | --+- | --++ | -+-- | -+-+ | -++- | -+++ | +--- | +--+ | +-+- | +-++ | ++-- | ++-+ | +++- | ++++ |
|---|---|---|---|---|---|---|---|---|---|---|---|---|---|---|---|---|
| −1, −3 | O | | | | O | | | | O | | | | O | | | |
| −1, −2 | O | O | | | O | O | | | O | O | | | O | O | | |
| −1, −1 | O | O | O | O | O | O | O | O | O | O | O | O | O | O | O | O |
| −1, 0 | O | O | O | O | O | O | O | O | O | O | O | O | O | O | O | O |
| −1, 1 | O | O | O | O | O | O | O | O | O | O | O | O | O | O | O | O |
| −1, 2 | | | | O | | | O | | | | O | | | | | O |
| 0, −3 | | | | | | | | | O | | | | O | | | |
| 0, −2 | O | O | | | O | O | | | O | O | | | O | O | | |
| 0, −1 | O | O | O | O | O | O | O | O | O | O | O | O | O | O | O | O |
| 0, 0 | O | O | O | O | O | O | O | O | O | O | O | O | O | O | O | O |
| 0, 1 | O | O | O | O | O | O | O | O | O | O | O | O | O | O | O | O |
| 0, 2 | | | O | O | | | O | O | | | O | O | | | O | O |
| 0, 3 | | | O | O | | | O | O | | | | | | | | |
| 1, −2 | O | | | | O | | | | O | | | | O | | | |
| 1, −1 | O | O | O | O | O | O | O | O | O | O | O | O | O | O | O | O |
| 1, −0 | O | O | O | O | O | O | O | o. | O | O | O | O | O | O | O | O |
| 1, 1 | O | O | O | O | O | O | O | O | O | O | O | O | O | O | O | O |
| 1, 2 | | | O | O | | | O | O | | | O | O | | | O | O |
| 1, 3 | | | O | | | | O | | | | O | | | | | O |
| 2, −2 | | | | | | | | | | | | | O | | | O |
| 2, −1 | | | | | | | | | | | | | O | O | | O |
| 2, 0 | | | | | O | O | O | O | | | | | O | O | O | O |
| 2, 1 | | | | | O | O | O | O | | | | | O | O | O | O |
| 2, 2 | | | | | | | O | O | | | | | | O | O | O |
| 2, 3 | | | | | | | O | O | | | | | | | O | O |
| 3, 0 | | | | | | | | | | | | | O | O | | |
| 3, 1 | | | | | | | | | | | | | O | O | O | O |
| 3, 2 | | | | | O | O | | | | | | | | | O | O |
| 3, 3 | | | | | O | O | | | | | | | | | O | O |

It can be seen from the Table that a maximum of 21 out of the 39 BMUs is used at each time. Depending on the current sequence of inputs, it can be determined which set of branch metrics will be needed, and accordingly how BMUs can be associated to them. Nine metrics are used in all combination of states. The remaining 30 can be separated into two groups of 15, that can share the same units. It can be seen that metrics from −3, −3 targets can share the unit with +3, +3 targets, etc.

Thus in a hardware implementation the same sample would be brought to the BMU input, but the target value will be negated. This negation would be very simple by use of sign-magnitude representation, since the branch metrics with the opposite sign are sharing the same unit. Sign-magnitude representation is also more power-efficient due to reduced switching around zero.

The preferred embodiment usage plan is shown in Table. The new branch metrics units now calculate the distances from 'folded' targets. Nine of them are always calculated, and they are represented in shaded portions of the Table, while 15 of them are shared with symmetrical usage. The 'folded' branch metrics calculations are represented by an F. "Folded" actually means that the same branch metrics unit calculates the distances from −3, −3 and +3, +3 targets, and similarly for all the other symmetrical pairs.

TABLE 19

The new branch metrics units usage plan.

Sign of input samples, previous, current two and next

| | ---- | ---+ | --+- | --++ | -+-- | -+-+ | -++- | -+++ | +--- | +--+ | +-+- | +-++ | ++-- | ++-+ | +++- | ++++ |
|---|---|---|---|---|---|---|---|---|---|---|---|---|---|---|---|---|
| −3, −3 | O | O | | | | | F | F | O | O | | | | | F | F |
| −3, −2 | O | O | | | | | F | F | O | O | | | | | F | F |
| −3, −1 | O | O | O | O | | | | | | | | | F | F | F | F |
| −3, 0 | | O | | O | | | | | | | | | F | | F | |
| −2, −3 | O | O | | | | | F | O | | | | | | | F | F |
| −2, −2 | O | O | O | | | | F | O | | | | | | F | F | F |
| −2, −1 | O | O | O | O | F | F | F | F | O | O | O | O | F | F | F | F |
| −2, 0 | O | O | O | O | F | F | F | F | O | O | O | O | F | F | F | F |
| −2, 1 | O | | O | O | | | | | | | | | F | F | | F |
| −2, 2 | | | | O | | | | | | | | | | F | | |
| −1, −3 | O | | | | F | O | | F | O | | | F | O | | F | |
| −1, −2 | O | O | F | F | O | O | F | F | O | O | F | F | O | O | F | F |
| −1, −1 | O | O | O | O | O | O | O | O | O | O | O | O | O | O | O | O |

TABLE 19-continued

The new branch metrics units usage plan.

Sign of input samples, previous, current two and next

| | ---- | ---+ | --+- | --++ | -+-- | -+-+ | -++- | -+++ | +--- | +--+ | +-+- | +-++ | ++-- | ++-+ | +++- | ++++ |
|---|---|---|---|---|---|---|---|---|---|---|---|---|---|---|---|---|
| -1, 0 | O | O | O | O | O | O | O | O | O | O | O | O | O | O | O | O |
| -1, 1 | O | O | O | O | O | O | O | O | O | O | O | O | O | O | O | O |
| -1, 2 | F |   |   | O | F |   |   | O | F |   |   | O | F |   |   | O |
| 0, -3 |   |   |   | F |   |   |   | F | O |   |   |   | O |   |   |   |
| 0, -2 | O | O | F | F | O | O | F | F | O | F | F | O | O | O | F | F |
| 0, -1 | O | O | O | O | O | O | O | O | O | O | O | O | O | O | O | O |
| 0, 0 | O | O | O | O | O | O | O | O | O | O | O | O | O | O | O | O |
| 0, 1 | O | O | O | O | O | O | O | O | O | O | O | O | O | O | O | O |
| 1, -1 | O | O | O | O | O | O | O | O | O | O | O | O | O | O | O | O |
| 1, -0 | O | O | O | O | O | O | O | O | O | O | O | O | O | O | O | O |
| 1, 1 | O | O | O | O | O | O | O | O | O | O | O | O | O | O | O | O |

ACS Usage and Assignment

Table summarizes the ACS unit size requirements of Tables 2–17, an X indicates no ACS required due to elimination of all branches to the corresponding state.

The preferred embodiments lower complexity by adding more ACS resources to the initial 4 four-way, 1 three-way, 4 two-way, and 2 one-way ACS units. The preferred embodiment assignment plan can be derived if the symmetrical pairs of states (binary one's complements, i.e., states 0 and

TABLE 20

ACS requirements for different states, for different input sequences.

| | ---- | ---+ | --+- | --++ | -+-- | -+-+ | -++- | -+++ | +--- | +--+ | +-+- | +-++ | ++-- | ++-+ | +++- | ++++ |
|---|---|---|---|---|---|---|---|---|---|---|---|---|---|---|---|---|
| 0 | 4 | 4 | 4 | 4 | 2 | 2 | 2 | 2 | 2 | 2 | 2 | 2 | 1 | 1 | 1 | 1 |
| 1 | X | 4 | X | 4 | X | 2 | X | 2 | X | 2 | X | 2 | X | 1 | X | 1 |
| 2 | 2 | 2 | 4 | 4 | 1 | 1 | 3 | 3 | 1 | 1 | 2 | 2 | 1 | 1 | 2 | 2 |
| 3 | X | X | X | 4 | X | X | X | 3 | X | X | X | 2 | X | X | X | 2 |
| 4 | 2 | 2 | 2 | 2 | 3 | 3 | 3 | 3 | 2 | 2 | 2 | 2 | 3 | 3 | 3 | 3 |
| 5 | | | | | | | | | | | | | | | | |
| 6 | 1 | 1 | 1 | 1 | 1 | 1 | 3 | 3 | 1 | 1 | 1 | 1 | 1 | 1 | 3 | 3 |
| 7 | X | X | 1 | 1 | X | X | 3 | 3 | X | X | 1 | 1 | X | X | 3 | 3 |
| 8 | 3 | X | 3 | X | 1 | 1 | X | X | 3 | 3 | X | X | 1 | 1 | X | X |
| 9 | 3 | 3 | 1 | 1 | 1 | 1 | 1 | 1 | 3 | 3 | 1 | 1 | 1 | 1 | 1 | 1 |
| 10 | | | | | | | | | | | | | | | | |
| 11 | 3 | 3 | 3 | 3 | 2 | 2 | 2 | 2 | 3 | 3 | 3 | 3 | 2 | 2 | 2 | 2 |
| 12 | 2 | X | X | X | 2 | X | X | X | 3 | X | X | X | 4 | X | X | X |
| 13 | 2 | 2 | 1 | 1 | 2 | 2 | 1 | 1 | 3 | 3 | 1 | 1 | 4 | 4 | 2 | 2 |
| 14 | 1 | X | 1 | X | 2 | X | 2 | X | 2 | X | 2 | X | 4 | X | 4 | X |
| 15 | 1 | 1 | 1 | 1 | 2 | 2 | 2 | 2 | 2 | 2 | 2 | 2 | 4 | 4 | 4 | 4 |

Figure 18A:
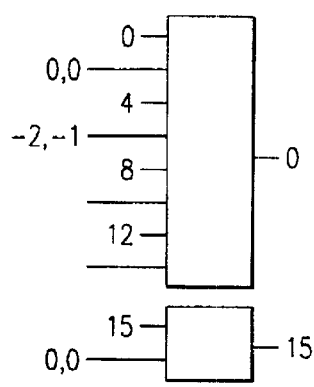
FIGS. 18a–18d show resource allocation.
Figure 18B:
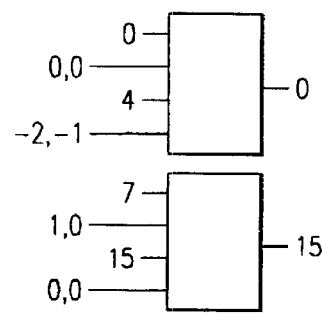

The assignment plan for the states that must share ACS units applied directly to Table leads to fairly complicated control logic and a large overhead in multiplexer logic. Multiplexers of different sizes, from two-way to five-way, are needed. In particular, FIGS. 18a–18d illustrate the minimal resources for the symmetric pair of states 0 and 15. In particular, FIG. 18a depicts the minimal resources for the case of sample inputs with the prior sample sign of –and the first current sample sign of − (corresponding to any of FIGS. 5a–5d and the left four columns of Table 20). FIG. 18a shows a four-way ACS unit for state 0 and a one-way ACS for state 15. The four-way ACS has the following inputs: BMUs for target sample pairs of 0,0; −2,−1; −1,0; and −3,−1 plus corresponding state metric inputs from the ACS units corresponding to states 0, 4, 8, and 12, respectively; the one-way ACS has the single BMU input for the target sample pair 0,0 and a single state metric input from the ACS for state 15 (itself). FIG. 18b shows the case corresponding to FIGS. 5e–5h and fifth through eighth columns of Table 20, FIG. 18c the case of FIGS. 5i–5l and ninth through twelfth columns, and FIG. 18d the case of FIGS. 5m–5p and the right four columns of Table 20. This illustrates the variation in ACS units and BMUs needed for states 0 and 15.

15, 1 and 14, 2 and 13, 3 and 12, 4 and 11, 6 and 9, and 7 and 8) share the same ACS resources. In that case, some ACS units have to be upgraded to accept more inputs. The minimum solution requires 4 four-way, 3 three-way 3 two-way ACS units and one adder for implementation.

Figure 18C:
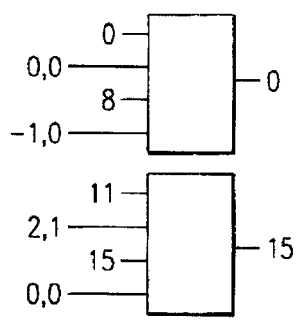
Figure 18D:
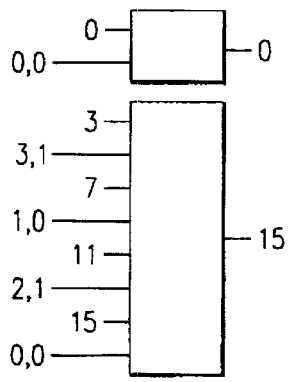
Figure 19A:
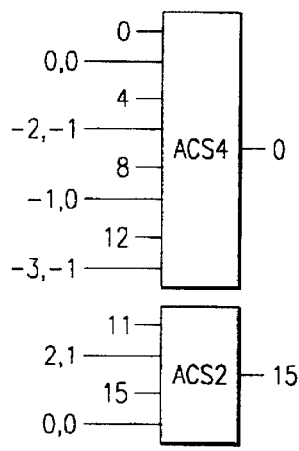
FIGS. 19a–19b show reduced resource allocation.
Figure 19B:
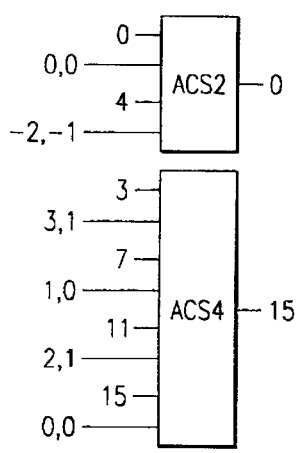
Figure 20:
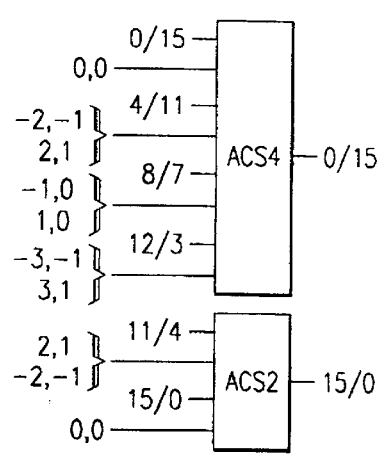
FIG. 20 illustrates resource sharing.

In the preferred embodiment implementation, the BMUs and ACS units would be assigned together; single BMUs would calculate the distance from opposite signed targets. This implementation eliminates the BMU multiplexers in front of ACS units, which share the corresponding branch metrics. Indeed, FIGS. 18a and 18d show the symmetric nature: opposite signed sample targets in the BMUs and symmetric state metrics. Similarly, FIGS. 18b and 18c show symmetry. FIGS. 19a–19b show upgrading with FIG. 19a the upgrade to include the FIGS. 18a and 18c cases, and FIG. 19b showing the upgrade to include the FIGS. 18b and 18d cases. Thus FIG. 19a corresponds to the first sample sign being − and FIG. 19b to the sign being +. Lastly, FIG. 20 shows the upgrades of FIGS. 19a–19b combined into a single four-way ACS plus single two-way ACS by sharing: the first state number in each pair corresponds to −− and +− sign samples (FIGS. 5a–5h) and the second state number to the −+ and ++ sign samples (FIGS. 5i–5p). Note that the same 0,0 target BMU can be used by both ACS units, but the −2,−1/2,1 BMU for the ACS4 differs from the 2,1/−2,−1 BMU for the ACS2; although in FIGS. 18a–18d only a single −2,−1/2,1 BMU would be needed. Thus the total number of BMUs increases beyond 21.

Multiplexers are needed both at the inputs and the outputs of the ACS units to implement the state sharing. Since the assignment is simple, only two control signals are needed at the input and at the output which will control 11 two-way MUXes at the input and 11 two-way DMUXes at the output. See FIG. 10 and the discussion below.

Figure 7:
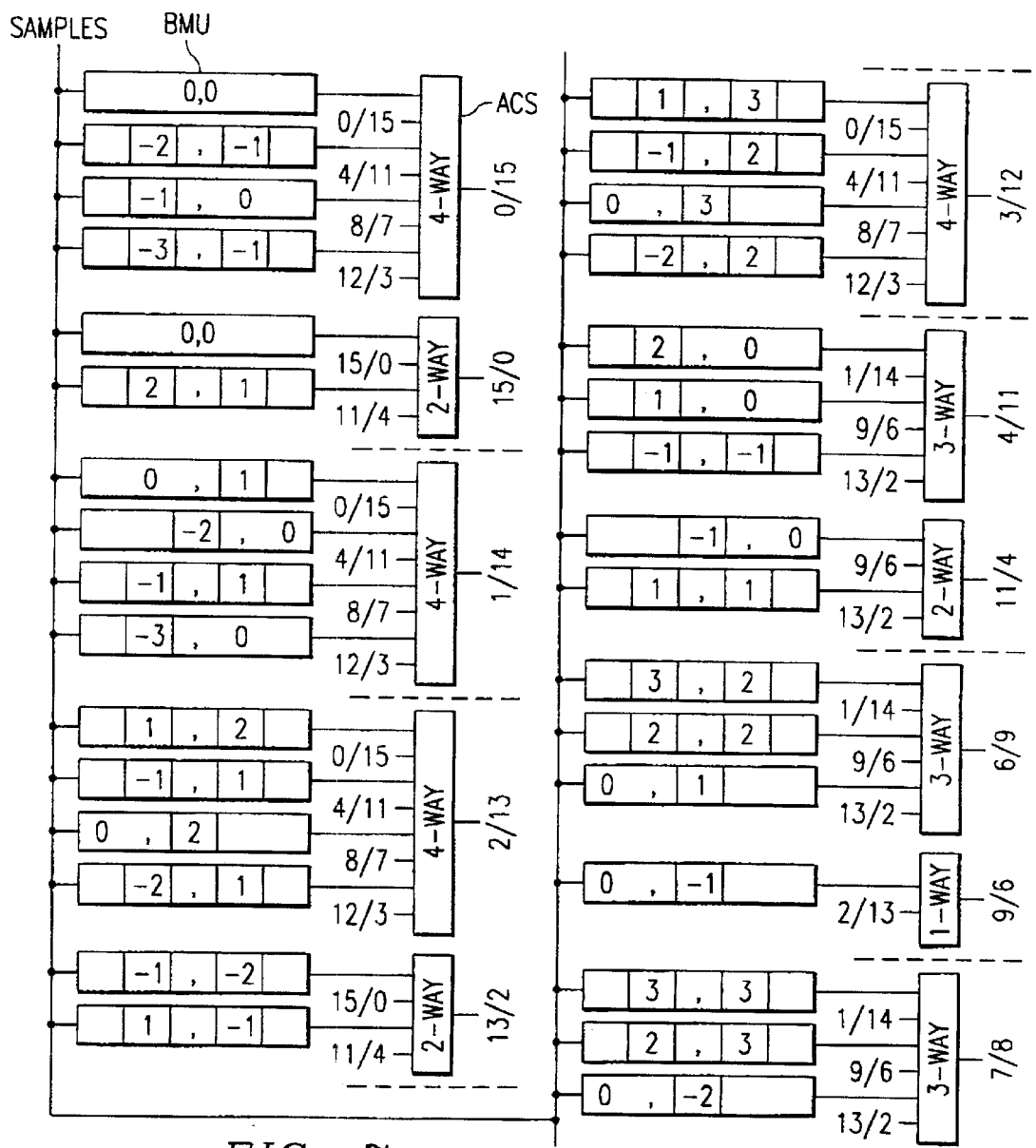
FIG. 7 illustrates ACS sharing.

The preferred embodiment state requirements for ACS units are shown in Table 21, and the sharing plan is illustrated in FIG. 7. Note that some BMUs provide inputs to more than one ACS unit, so only 27 different BMUs suffices. In particular, the 0,0 BMU feeds both the 0/15 ACS and the 15/0 ACS, the −1,0 BMU feeds both the 0/15 ACS and the 11/4 ACS, the 0,1 BMU feeds both the 1/14 ACS and the 6/9 ACS, the −1,1 BMU feeds both the 1/14 ACS and the 2/13 ACS, and the 0,2 BMU feeds both the 2/13 ACS and the 7/8 ACS.

and so the 4-way ACS only uses two BMUs. But state 15 has two inputs (state 11 to state 15 and state 15 to state 15), and so the 2-way ACS for state 15 uses both the target 0,0 and target 2,1 BMUs. Of course, for the sample signs such as FIG. 5p, the state 15 has the four inputs and uses the 4-way ACS unit and state 0 has one input as uses the 2-way ACS unit; and the BMUs use the opposite sign target levels (state 15 to state 15 has 0,0; state 11 to state 15 has +2,+1; state 7 to state 15 has +1,0; and state 3 to state 15 has +3,+1 which are just the negatives of the state 0 to state 0 for FIG. 5a sample signs).

Figure 16:
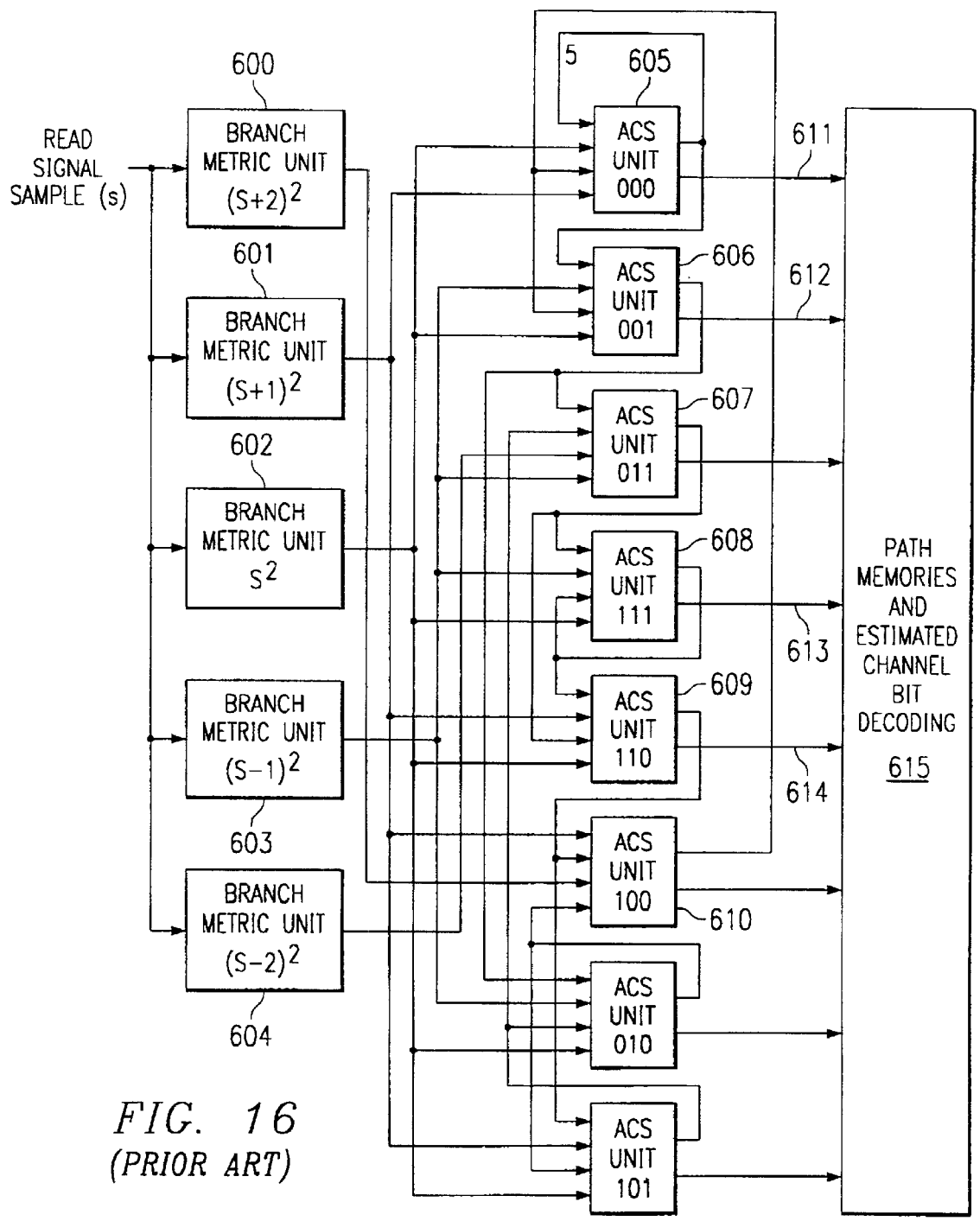
FIG. 16 shows a Viterbi detector.

FIG. 7 also shows each ACS unit has state metric inputs from the ACS units although the complete connecting lines are not shown in the same manner as in FIG. 16. The 4-way ACS unit has inputs from the 0/15 ACS (itself), 4/11 ACS, 8/7 ACS, and 12/3 ACS (recall that states 0, 4, 8, and 12 are the inputs to state 0 in FIG. 5a), and the 2-way ACS has the 15/0 ACS (itself) and 11/4 ACS as inputs.

Control Logic

Since the pairs of symmetric states 0 and 15, 1 and 14, 2 and 13 share the same resources, the control logic is simple.

TABLE 21

Upgraded ACS size requirements.

| | ---- | ---+ | --+- | --++ | -+-- | -+-+ | -++- | -+++ | +--- | +--+ | +-+- | +-++ | ++-- | ++-+ | +++- | ++++ |
|---|---|---|---|---|---|---|---|---|---|---|---|---|---|---|---|---|
| 0 | 4 | 4 | 4 | 4 | 4 | 4 | 4 | 4 | 2 | 2 | 2 | 2 | 2 | 2 | 2 | 2 |
| 1 | X | 4 | X | 4 | X | 4 | X | 4 | X | 4 | X | 4 | X | 4 | X | 4 |
| 2 | 4 | 4 | 4 | 4 | 4 | 4 | 4 | 4 | 2 | 2 | 2 | 2 | 2 | 2 | 2 | 2 |
| 3 | X | 4 | X | 4 | X | 4 | X | 4 | X | 4 | X | 4 | X | 4 | X | 4 |
| 4 | 2 | 2 | 2 | 2 | 3 | 3 | 3 | 3 | 2 | 2 | 2 | 2 | 3 | 3 | 3 | 3 |
| 5 | | | | | | | | | | | | | | | | |
| 6 | 1 | 1 | 3 | 3 | 1 | 1 | 3 | 3 | 1 | 1 | 3 | 3 | 1 | 1 | 3 | 3 |
| 7 | X | X | 3 | 3 | X | X | 3 | 3 | X | X | 3 | 3 | X | X | 3 | 3 |
| 8 | 3 | 3 | X | X | 3 | 3 | X | X | 3 | 3 | X | X | 3 | 3 | X | X |
| 9 | 3 | 3 | 1 | 1 | 3 | 3 | 1 | 1 | 3 | 3 | 1 | 1 | 3 | 3 | 1 | 1 |
| 10 | | | | | | | | | | | | | | | | |
| 11 | 3 | 3 | 3 | 3 | 2 | 2 | 2 | 2 | 3 | 3 | 3 | 3 | 2 | 2 | 2 | 2 |
| 12 | 4 | X | 4 | X | 4 | X | 4 | X | 4 | X | 4 | X | 4 | X | 4 | X |
| 13 | 2 | 2 | 2 | 2 | 2 | 2 | 2 | 2 | 4 | 4 | 4 | 4 | 4 | 4 | 4 | 4 |
| 14 | 4 | X | 4 | X | 4 | X | 4 | X | 4 | X | 4 | X | 4 | X | 4 | X |
| 15 | 2 | 2 | 2 | 2 | 2 | 2 | 2 | 2 | 4 | 4 | 4 | 4 | 4 | 4 | 4 | 4 |

FIG. 7 has horizontal broken lines to show the ACS units sharing, associated BMUs, and states. For example, consider the top two ACS blocks (a 4-way and a 2-way): the right-hand outputs labeled 0/15 and 15/0 indicate that when the 4-way ACS unit is assigned to state 0, then the 2-way ACS unit is assigned to state 15, and conversely.

Next, presume that the signs of the prior, current two, and next samples are all negative; this means FIG. 5a applies and indicates four two-step branches enter state 0 and only a single branch enters state 15. Then looking at FIG. 4, the target sample levels for the state 0 to state 0 two-step branch are 0,0; for state 4 to state 0 the samples are: −2,−1; for state 8 to state 0 the samples are −1,0; and for state 12 to state 0 the samples are −3,−1. This corresponds to the lefthand BMUs in FIG. 7 for input to the top 4-way ACS with target levels 0,0; −2,−1; −1,0; and −3,−1.

Similarly, the single two-step branch from state 15 to state 15 has target sample levels of 0,0. The BMUs for the 2-way have targets 0,0 and 2,1. Only the target 0,0 BMU and a 1-way ACS unit are needed for the FIG. 5a sample signs input, thus this reflects the preferred embodiment ACS upgrade. Indeed, for the FIG. 5e sample signs −+−−, state 0 has only two inputs (state 0 to state 0 and state 8 to state 0)

The problem that arises by adding more branches in the trellis (the added inputs to the upgraded ACS units beyond the minimal), is that some of the states that generate them do not exist. Such states are labeled in italics in the tables, and in the calculation of new states should not be considered by the comparators.

Invalid states exist in cases where two states share only one ACS resource (states 1 and 14, 3 and 12, 7 and 8). These invalid states should be disabled (flagged) in the ACS units so that they will not produce the lowest state metric during the comparison.

TABLE 22

New ACS operations for samples signs as follows.
previous sample: −; current samples: − −; next: −.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | Term | |

TABLE 22-continued

New ACS operations for samples signs as follows.
previous sample: −; current samples: − −; next: −.

| State | Operation | Unit |
|---|---|---|
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | Term | |
| 0100 | sm(1001) +bm(1,0)<br>sm(1101) + bm(−1,−1) | ACS2(1/14) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1 1 1 0) + bm(−3,−2) | ACS3(6/9) |
| 1010 | | |
| 1011 | sm(0010) + bm(1,1)<br>sm(0110) + bm(−1,0)<br>sm(1110) + bm(−2,0) | ACS3(4/11) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(1011) + bm(1,−1)<br>sm(1111) + bm(−1,−2) | ACS2(13/2) |
| 1110 | sm(0011) + bm(3,0)<br>sm(0111) + bm(1,−1)<br>sm(1011) + bm(2,0)<br>sm(1111) + bm(0,−1) | ACS4 (1/14) |
| 1111 | sm(1011) + bm(2,1)<br>sm(1111) + bm(0,0) | ACS2(15/0) |

TABLE 23

New ACS operations for previous
sample: −; current samples: − −; next: +.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | sm(0000) + bm(0,1)<br>sm(0100) + bm(−2,0)<br>sm(1000) + bm(−1,1)<br>sm(1100) + bm(−3,0) | ACS4(1/14) |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | sm(0000) + bm(1,3)<br>sm(0100) + bm(−1,2)<br>sm(1000) + bm(0,3)<br>sm(1100) + bm(−2,2) | ACS4(3/12) |
| 0100 | sm(1001) + bm(1,0)<br>sm(1101) + bm(−1,−1) | ACS2(11/4) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0)<br>sm(1110) + bm(−2,0) | ACS3(4/11) |

TABLE 23-continued

New ACS operations for previous
sample: −; current samples: − −; next: +.

| State | Operation | Unit |
|---|---|---|
| 1100 | Term | |
| 1101 | sm(1011) + bm(1,−1)<br>sm(1111) + bm(−1,−2) | ACS2(13/2) |
| 1110 | Term | |
| 1111 | sm(1011) + bm(2,1)<br>sm(1111) + bm(0,0) | ACS2(15/0) |

TABLE 24

New ACS operations for previous
sample: −; current samples: − +; next: −.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | Term | |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | Term | |
| 0100 | sm(1001) + bm(1,0)<br>sm(1101) + bm(−1,−1) | ACS2(11/4) |
| 0101 | | |
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0)<br>sm(1110) + bm(−2,0) | ACS3(4/11) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(1011) + bm(1,−1)<br>sm(1111) + bm(−1,−2) | ACS2(13/2) |
| 1110 | sm(0011) + bm(3,0)<br>sm(0111) + bm(1,−1)<br>sm(1011) + bm(2,0)<br>sm(1111) + bm(0,−1) | ACS4 (1/14) |
| 1111 | sm(1011) + bm(2,1)<br>sm(1111) + bm(0,0) | ACS2(15/0) |

TABLE 25

New ACS operations for previous
sample: −; current samples: −+; next: +.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | sm(0000) + bm(0,1)<br>sm(0100) + bm(−2,0)<br>sm(1000) + bm(−1,1)<br>sm(1100) + bm(−3,0) | ACS4(1/14) |
| 0010 | sm(0000) + bm(1,2)<br>sm(0100) + bm(−1,1) | ACS4(2/13) |

TABLE 25-continued

New ACS operations for previous
sample: −; current samples: −+; next: +.

| State | Operation | Unit |
|---|---|---|
| 0011 | sm(1000) + bm(0,2)<br>sm(1100) + bm(−2,1)<br>sm(0000) + bm(1,3)<br>sm(0100) + bm(−1,2)<br>sm(1000) + bm(0,3)<br>sm(1100) + bm(−2,2) | ACS4(3/12) |
| 0100 | sm(1001) + bm(1,0)<br>sm(1101) + bm(−1,−1) | ACS2(11/4) |
| 0101 | | |
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0)<br>sm(1110) + bm(−2,0) | ACS3(4/11) |
| 1100 | Term | |
| 1101 | sm(1011) + bm(1,−1)<br>sm(1111) + bm(−1,−2) | ACS2(13/2) |
| 1110 | Term | |
| 1111 | sm(1011) + bm(2,1)<br>sm(1111) + bm(0,0) | ACS2(15/0) |

TABLE 26

New ACS operations for previous
sample: −; current samples: +−; next: −.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | Term | |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | Term | |
| 0100 | sm(0001) + bm(2,0)<br>sm(1001) + bm(1,0)<br>sm(1101) + bm(−1,−1) | ACS3(4/11) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0) | ACS2(11/4) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(1011) + bm(1,−1)<br>sm(1111) + bm(−1,−2) | ACS2(13/2) |
| 1110 | sm(0011) + bm(3,0)<br>sm(0111) + bm(1,−1)<br>sm(1011) + bm(2,0)<br>sm(1111) + bm(0,−1) | ACS4(1/14) |

TABLE 26-continued

New ACS operations for previous
sample: −; current samples: +−; next: −.

| State | Operation | Unit |
|---|---|---|
| 1111 | sm(1011) + bm(2,1)<br>sm(1111) + bm(0,0) | ACS2(15/0) |

TABLE 27

New ACS operations for previous
sample: −; current samples: +−; next: +.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | sm(0000) + bm(0,1)<br>sm(0100) + bm(−2,0)<br>sm(1000) + bm(−1,1)<br>sm(1100) + bm(−3,0) | ACS4(1/14) |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | sm(0000) + bm(1,3)<br>sm(0100) + bm(−1,2)<br>sm(1000) + bm(0,3)<br>sm(1100) + bm(−2,2) | ACS4(3/12) |
| 0100 | sm(0001) + bm(2,0)<br>sm(1001) + bm(1,0)<br>sm(1101) + bm(−1,−1) | ACS3(4/11) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0) | ACS2(11/4) |
| 1100 | Term | |
| 1101 | sm(1011) + bm(1,−1)<br>sm(1111) + bm(−1,−2) | ACS2(13/2) |
| 1110 | Term | |
| 1111 | sm(1011) + bm(2,1)<br>sm(1111) + bm(0,0) | ACS2(15/0) |

TABLE 28

New ACS operations for previous
sample: −; current samples: ++; next −.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | Term | |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | Term | |
| 0100 | sm(0001) + bm(2,0)<br>sm(1001) + bm(1,0)<br>sm(1101) + bm(−1,−1) | ACS3(4/11) |
| 0101 | | |

TABLE 28-continued

New ACS operations for previous
sample: −; current samples: ++; next −.

| State | Operation | Unit |
|---|---|---|
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0) | ACS2(11/4) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(1011) + bm(1,−1)<br>sm(1111) + bm(−1,−2) | ACS2(13/2) |
| 1110 | sm(0011) + bm(3,0)<br>sm(0111) + bm(1,−1)<br>sm(1011) + bm(2,0)<br>sm(1111) + bm(0,−1) | ACS4(1/14) |
| 1111 | sm(1011) + bm(2,1)<br>sm(1111) + bm(0,0) | ACS2(15/0) |

TABLE 29

New ACS operations for previous
sample: −; current samples: ++; next: +.

| State | Operation | Unit |
|---|---|---|
| 0000 | sm(0000) + bm(0,0)<br>sm(0100) + bm(−2,−1)<br>sm(1000) + bm(−1,0)<br>sm(1100) + bm(−3,−1) | ACS4(0/15) |
| 0001 | sm(0000) + bm(0,1)<br>sm(0100) + bm(−2,0)<br>sm(1000) + bm(−1,1)<br>sm(1100) + bm(−3,0) | ACS4(1/14) |
| 0010 | sm(0000) + bm(1,2)<br>sm(0100) + bm(−1,1)<br>sm(1000) + bm(0,2)<br>sm(1100) + bm(−2,1) | ACS4(2/13) |
| 0011 | sm(0000) + bm(1,3)<br>sm(0100) + bm(−1,2)<br>sm(1000) + bm(0,3)<br>sm(1100) + bm(−2,2) | ACS4(3/12) |
| 0100 | sm(0001) + bm(2,0)<br>sm(1001) + bm(1,0)<br>sm(1101) + bm(−1,−1) | ACS3(4/11) |
| 0101 | | |
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0) | ACS2(11/4) |
| 1100 | Term | |
| 1101 | sm(1011) + bm(1,−1)<br>sm(1111) + bm(−1,−2) | ACS2(13/2) |
| 1110 | Term | |
| 1111 | sm(1011) + bm(2,1)<br>sm(1111) + bm(0,0) | ACS2(15/0) |

TABLE 30

New ACS operations for previous
sample: +; current samples: −−; next: −.

| State | Operation | Unit |
|---|---|---|
| 0000 | sm(0000) + bm(0,0)<br>sm(0100) + bm(−2,−1) | ACS2(15/0) |
| 0001 | Term | |
| 0010 | sm(0000) + bm(1,2)<br>sm(0100) + bm(−1,1) | ACS2(13/2) |
| 0011 | Term | |
| 0100 | sm(1001) + bm(1,0)<br>sm(1101) + bm(−1,−1) | ACS2(11/4) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0)<br>sm(1110) + bm(−2,0) | ACS3(4/11) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(0011) + bm(2,−1)<br>sm(0111) + bm(0,−2)<br>sm(1011) + bm(1,−1)<br>sm(1111) + bm(−1,−2) | ACS4(2/13) |
| 1110 | sm(0011) + bm(3,0)<br>sm(0111) + bm(1,−1)<br>sm(1011) + bm(2,0)<br>sm(1111) + bm(0,−1) | ACS4(1/14) |
| 1111 | sm(0011) + bm(3,1)<br>sm(0111) + bm(1,0)<br>sm(1011) + bm(2,1)<br>sm(1111) + bm(0,0) | ACS4(0/15) |

TABLE 31

New ACS operations for previous
sample: +; current samples: −−; next: +.

| State | Operation | Unit |
|---|---|---|
| 0000 | sm(0000) + bm(0,0)<br>sm(0100) + bm(−2,−1) | ACS2(15/0) |
| 0001 | sm(0000) + bm(0,1)<br>sm(0100) + bm(−2,0)<br>sm(1000) + bm(−1,1)<br>sm(1100) + bm(−3,0) | ACS4(1/14) |
| 0010 | sm(0000) + bm(1,2)<br>sm(0100) + bm(−1,1) | ACS2(13/2) |
| 0011 | sm(0000) + bm(1,3)<br>sm(0100) + bm(−1,2)<br>sm(1000) + bm(0,3)<br>sm(1100) + bm(−2,2) | ACS4(3/12) |
| 0100 | sm(1001) + bm(1,0)<br>sm(1101) + bm(−1,−1) | ACS2(11/4) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0) | ACS3(4/11) |

TABLE 31-continued

New ACS operations for previous
sample: +; current samples: −−; next: +.

| State | Operation | Unit |
|---|---|---|
| 1100 | sm(1110) + bm(−2,0)<br>Term | |
| 1101 | sm(0011) + bm(2,−1)<br>sm(0111) + bm(0,−2)<br>sm(1011) + bm(1,−1)<br>sm(1111) + bm(−1,−2) | ACS4(2/13) |
| 1110 | Term | |
| 1111 | sm(0011) + bm(3,1)<br>sm(0111) + bm(1,0)<br>sm(1011) + bm(2,1)<br>sm(1111) + bm(0,0) | ACS4(0/15) |

TABLE 32

New ACS operations for previous
sample: +; current samples: −+; next: −.

| State | Operation | Unit |
|---|---|---|
| 0000 | sm(0000) + bm(0,0)<br>sm(0100) + bm(−2,−1) | ACS2(15/0) |
| 0001 | Term | |
| 0010 | sm(0000) + bm(1,2)<br>sm(0100) + bm(−1,1) | ACS2(13/2) |
| 0011 | Term | |
| 0100 | sm(1001) + bm(1,0)<br>sm(1101) + bm(−1,−1) | ACS2(11/4) |
| 0101 | | |
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0)<br>sm(1110) + bm(−2,0) | ACS3(4/11) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(0011) + bm(2,−1)<br>sm(0111) + bm(0,−2)<br>sm(1011) + bm(1,−1)<br>sm(1111) + bm(−1,−2) | ACS4(2/13) |
| 1110 | sm(0011) + bm(3,0)<br>sm(0111) + bm(1,−1)<br>sm(1011) + bm(2,0)<br>sm(1111) + bm(0,−1) | ACS4(1/14) |
| 1111 | sm(0011) + bm(3,1)<br>sm(0111) + bm(1,0)<br>sm(1011) + bm(2,1)<br>sm(1111) + bm(0,0) | ACS4(0/15) |

TABLE 33

New ACS operations for previous
sample: +; current samples: −+; next: +.

| State | Operation | Unit |
|---|---|---|
| 0000 | sm(0000) + bm(0,0)<br>sm(0100) + bm(−2,−1) | ACS2(15/0) |
| 0001 | sm(0000) + bm(0,1)<br>sm(0100) + bm(−2,0)<br>sm(1000) + bm(−1,1) | ACS4(1/14) |

TABLE 33-continued

New ACS operations for previous
sample: +; current samples: −+; next: +.

| State | Operation | Unit |
|---|---|---|
| | sm(1100) + bm(−3,0) | |
| 0010 | sm(0000) + bm(1,2)<br>sm(0100) + bm(−1,1) | ACS2(13/2) |
| 0011 | sm(0000) + bm(1,3)<br>sm(0100) + bm(−1,2)<br>sm(1000) + bm(0,3)<br>sm(1100) + bm(−2,2) | ACS4(3/12) |
| 0100 | sm(1001) + bm(1,0)<br>sm(1101) + bm(−1,−1) | ACS2(11/4) |
| 0101 | | |
| 0110 | sm(0001) + bm(3,2)<br>sm(1001) + bm(2,2)<br>sm(1101) + bm(0,1) | ACS3(6/9) |
| 0111 | sm(0001) + bm(3,3)<br>sm(1001) + bm(2,3)<br>sm(1101) + bm(0,2) | ACS3(7/8) |
| 1000 | Term | |
| 1001 | sm(0010) + bm(0,−1) | ACS1(9/6) |
| 1010 | | |
| 1011 | sm(0010) + bm(1,1)<br>sm(0110) + bm(−1,0)<br>sm(1110) + bm(−2,0) | ACS3(4/11) |
| 1100 | Term | |
| 1101 | sm(0011) + bm(2,−1)<br>sm(0111) + bm(0,−2)<br>sm(1011) + bm(1,−1)<br>sm(1111) + bm(−1,−2) | ACS4(2/13) |
| 1110 | Term | |
| 1111 | sm(0011) + bm(3,1)<br>sm(0111) + bm(1,0)<br>sm(1011) + bm(2,1)<br>sm(1111) + bm(0,0) | ACS4(0/15) |

TABLE 34

New ACS operations for previous
sample: +; current samples: +−; next: −.

| State | Operation | Unit |
|---|---|---|
| 0000 | sm(0000) + bm(0,0)<br>sm(0100) + bm(−2,−1) | ACS2(15/0) |
| 0001 | Term | |
| 0010 | sm(0000) + bm(1,2)<br>sm(0100) + bm(−1,1) | ACS2(13/2) |
| 0011 | Term | |
| 0100 | sm(0001) + bm(2,0)<br>sm(1001) + bm(1,0)<br>sm(1101) + bm(−1,−1) | ACS3(4/11) |
| 0101 | | |
| 0110 | sm(1101) + bm(0,1) | ACS1(9/6) |
| 0111 | Term | |
| 1000 | sm(0010) + bm(0,−2)<br>sm(0110) + bm(−2,−3)<br>sm(1110) + bm(−3,−3) | ACS3(7/8) |
| 1001 | sm(0010) + bm(0,−1)<br>sm(0110) + bm(−2,−2)<br>sm(1110) + bm(−3,−2) | ACS3(6/9) |
| 1010 | | |
| 1011 | sm(0010) + bm(1,1)<br>sm(0110) + bm(−1,0) | ACS2(11/4) |
| 1100 | sm(0011) + bm(2,−2)<br>sm(0111) + bm(0,−3)<br>sm(1011) + bm(1,−2)<br>sm(1111) + bm(−1,−3) | ACS4(3/12) |
| 1101 | sm(0011) + bm(2,−1)<br>sm(0111) + bm(0,−2)<br>sm(1011) + bm(1,−1)<br>sm(1111) + bm(−1,−2) | ACS4(2/13) |
| 1110 | sm(0011) + bm(3,0)<br>sm(0111) + bm(1,−1) | ACS4(1/14) |

TABLE 34-continued

New ACS operations for previous
sample: +; current samples: + −; next: −.

| State | Operation | Unit |
|---|---|---|
| 1111 | sm(1011) + bm(2,0)<br>sm(1111) + bm(0,−1)<br>sm(0011) + bm(3,1)<br>sm(0111) + bm(1,0)<br>sm(1011) + bm(2,1)<br>sm(1111) + bm(0,0) | ACS4(0/15) |

TABLE 35

New ACS operations for previous
sample: +; current samples: + −; next: +.

| State | Operation | Unit |
|---|---|---|
| 0000 | sm(0000) + bm(0, 0) | ACS2(15/0) |
| 0001 | sm(0000) + bm(0, 1)<br>sm(0100) + bm(−2, −1)<br>sm(0100) + bm(−2, 0)<br>sm(1000) + bm(−1, 1)<br>sm(1100) + bm(−3, 0) | ACS4(1/14) |
| 0010 | sm(0000) + bm(1, 2)<br>sm(0100) + bm(−1, 1) | ACS2(13/2) |
| 0011 | sm(0000) + bm(1, 3)<br>sm(0100) + bm(−1, 2)<br>sm(1000) + bm(0, 3)<br>sm(1100) + bm(−2, 2) | ACS4(3/12) |
| 0100 | sm(0001) + bm(2, 0)<br>sm(1001) + bm(1, 0)<br>sm(1101) + bm(−1, −1) | ACS3(4/11) |
| 0101 | | |
| 0110 | sm(1101) + bm(0, 1) | ACS1(9/6) |
| 0111 | Term | |
| 1000 | sm(0010) + bm(0, −2)<br>sm(0110) + bm(−2, −3)<br>sm(1110) + bm(−3, −3) | ACS3(7/8) |
| 1001 | sm(0010) + bm(0, −1)<br>sm(0110) + bm(−2, −2)<br>sm(1110) + bm(−3, −2) | ACS3(6/9) |
| 1010 | | |
| 1011 | sm(0010) + bm(1, 1)<br>sm(0110) + bm(−1, 0) | ACS2(11/4) |
| 1100 | Term | |
| 1101 | sm(0011) + bm(2, −1)<br>sm(0111) + bm(0, −2)<br>sm(1011) + bm(1, −1)<br>sm(1111) + bm(−1, −2) | ACS4(2/13) |
| 1110 | Term | |
| 1111 | sm(0011) + bm(3, 1)<br>sm(0111) + bm(1, 0)<br>sm(1011) + bm(2, 1)<br>sm(1111) + bm(0, 0) | ACS4(0/15) |

TABLE 36

New ACS operations for previous
sample: +; current samples: + +; next: −.

| State | Operation | Unit |
|---|---|---|
| 0000 | sm(0000) + bm(0, 0)<br>sm(0100) + bm(−2, −1) | ACS2(15/0) |
| 0001 | Term | |
| 0010 | sm(0000) + bm(1, 2)<br>sm(0100) + bm(−1, 1) | ACS2(13/2) |
| 0011 | Term | |
| 0100 | sm(0001) + bm(2, 0)<br>sm(1001) + bm(1, 0)<br>sm(1101) + bm(−1, −1) | ACS3(4/11) |
| 0101 | | |

TABLE 36-continued

New ACS operations for previous
sample: +; current samples: + +; next: −.

| State | Operation | Unit |
|---|---|---|
| 0110 | sm(0001) + bm(3, 2)<br>sm(1001) + bm(2, 2)<br>sm(1101) + bm(0, 1) | ACS3(6/9) |
| 0111 | sm(0001) + bm(3, 3)<br>sm(1001) + bm(2, 3)<br>sm(1101) + bm(0, 2) | ACS3(7/8) |
| 1000 | Term | |
| 1001 | sm(0010) + bm(0, −1) | ACS1(9/6) |
| 1010 | | |
| 1011 | sm(0010) + bm(1, 1)<br>sm(0110) + bm(−1, 0) | ACS2(11/4) |
| 1100 | sm(0011) + bm(2, −2)<br>sm(0111) + bm(0, −3)<br>sm(1011) + bm(1, −2)<br>sm(1111) + bm(−1, −3) | ACS4(3/12) |
| 1101 | sm(0011) + bm(2, −1)<br>sm(0111) + bm(0, −2)<br>sm(1011) + bm(1, −1)<br>sm(1111) + bm(−1, −2) | ACS4(2/13) |
| 1110 | sm(0011) + bm(3, 0)<br>sm(0111) + bm(1, −1)<br>sm(1011) + bm(2, 0)<br>sm(1111) + bm(0, −1) | ACS4(1/14) |
| 1111 | sm(0011) + bm(3, 1)<br>sm(0111) + bm(1, 0)<br>sm(1011) + bm(2, 1)<br>sm(1111) + bm(0, 0) | ACS4(0/15) |

TABLE 37

New ACS operations for previous
sample: +; current samples: + +; next: +.

| State | Operation | Unit |
|---|---|---|
| 0000 | sm(0000) + bm(0, 0)<br>sm(0100) + bm(−2, −1) | ACS2(15/0) |
| 0001 | sm(0000) + bm(0, 1)<br>sm(0100) + bm(−2, 0)<br>sm(1000) + bm(−1, 1)<br>sm(1100) + bm(−3, 0) | ACS4(1/14) |
| 0010 | sm(0000) + bm(1, 2)<br>sm(0100) + bm(−1, 1) | ACS2(13/2) |
| 0011 | sm(0000) + bm(1, 3)<br>sm(0100) + bm(−1, 2)<br>sm(1000) + bm(0, 3)<br>sm(1100) + bm(−2, 2) | ACS4(3/12) |
| 0100 | sm(0001) + bm(2, 0)<br>sm(1001) + bm(1, 0)<br>sm(1101) + bm(−1, −1) | ACS3(4/11) |
| 0101 | | |
| 0110 | sm(0001) + bm(3, 2)<br>sm(1001) + bm(2, 2)<br>sm(1101) + bm(0, 1) | ACS3(6/9) |
| 0111 | sm(0001) + bm(3, 3)<br>sm(1001) + bm(2, 3)<br>sm(1101) + bm(0, 2) | ACS3(7/8) |
| 1000 | Term | |
| 1001 | sm(0010) + bm(0, −1) | ACS1(9/6) |
| 1010 | | |
| 1011 | sm(0010) + bm(1, 1)<br>sm(0110) + bm(−1, 0) | ACS2(11/4) |
| 1100 | Term | |
| 1101 | sm(0011) + bm(2, −1)<br>sm(0111) + bm(0, −2)<br>sm(1011) + bm(1, −1)<br>sm(1111) + bm(−1, −2) | ACS4(2/13) |
| 1110 | Term | |

TABLE 37-continued

New ACS operations for previous
sample: +; current samples: + +; next: +.

| State | Operation | Unit |
|-------|-----------|------|
| 1111  | sm(0011) + bm(3, 1) | ACS4(0/15) |
|       | sm(0111) + bm(1, 0) | |
|       | sm(1011) + bm(2, 1) | |
|       | sm(1111) + bm(0, 0) | |

Branch Metrics Units

The calculation of branch metrics is done in branch metrics units. They calculate the distance between the input sample and seven possible targets of $E^2PR4$ equalization.

The preferred embodiment method reuses the branch metrics. Since the decision which ACS is used is based on the input sample sign, only five branch metrics have to be calculated for each sample:

$$bm_{+3/-3} = \|x - t_3\|$$

$$bm_{+2/-2} = \|x - t_2\|$$

$$bm_{+1/-1} = \|x - t_1\|$$

$$bm_0 = \|x - t_0\|$$

$$bm_{-1/+1} = \|x - t_{-1}\|$$

in the case of positive sample, or $$bm_{+3/-3} = \|x - t_{-3}\|$$

$$bm_{+2/-2} = \|x - t_{-2}\|$$

$$bm_{-1/-1} = \|x - t_{-1}\|$$

$$bm_0 = \|x - t_0\|$$

$$bm_{-1/+1} = \|x - t_{+1}\|$$

in the case of the negative sample.

So the branch metrics calculation in single-step implementation can be done by using only five branch metrics units. The input sample is represented in sign magnitude representation, and the sign (the sequence of signs) is used to select the multiplexor inputs in front of ACS units. The magnitude is used to calculate the absolute distance from targets.

Branch Metrics Unit Implementation

Figure 8:
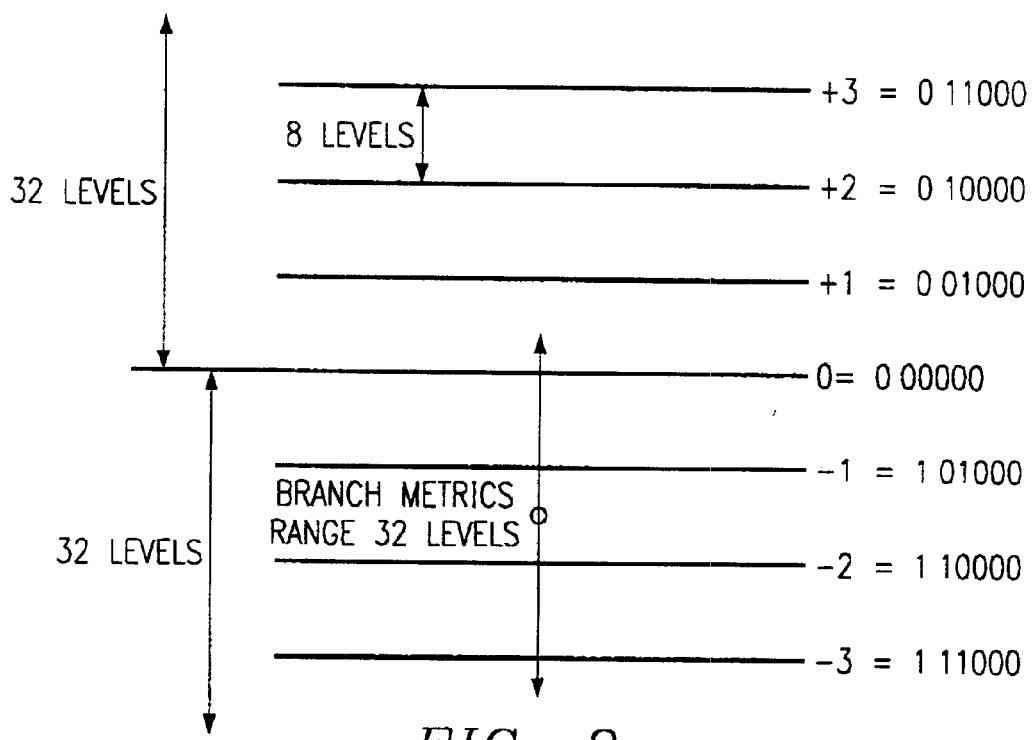
FIGS. 8–9 show branch metric computations.

In case of a 6-bit A/D converter 123 output, the input signal to Viterbi detector 125 can have 64 possible signal levels, 32 positive, and 32 negative (including zero). This is illustrated in FIG. 8.

The preferred embodiment uses a 4-bit branch metric to cover 16 signal levels on each side of the sample, since the metric is strictly positive. This is consistent with the implementation which limited the calculation of branch metrics to only two neighboring targets as in FIG. 2 although branches are not eliminated.

In the case of additive Gaussian noise the branch metric is ideally implemented as squared distance from the sample to the target. It can be approximated as linear:

$$\|x - t\| = \begin{cases} |x - t|, & \text{linear} \\ (x - t)^2, & \text{squared} \end{cases}$$

The preferred embodiment implementation using the linear metric is simple and results in efficient hardware realization with small penalty in performance degradation.

Figure 9:
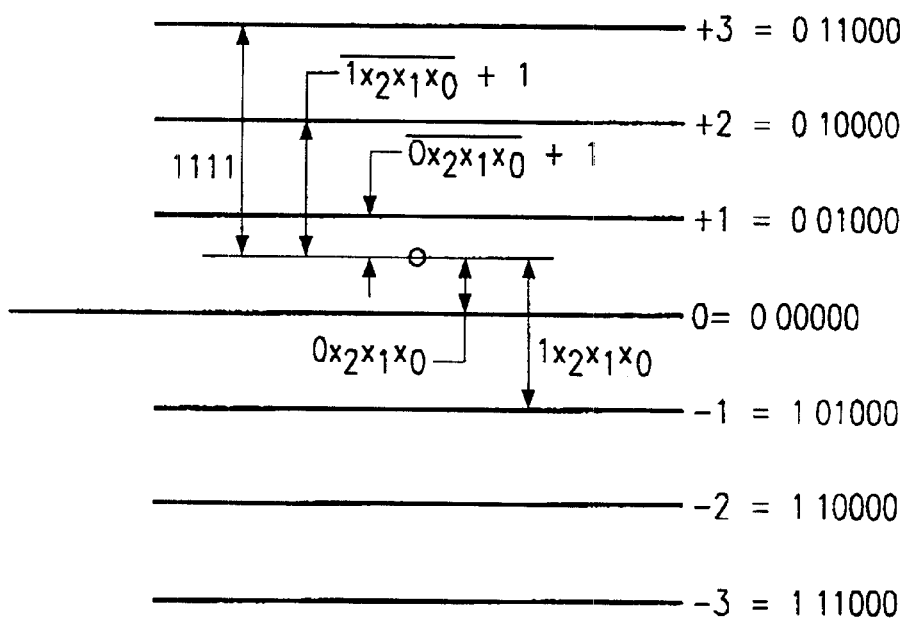

The input sample to Viterbi detector 125 is represented as a 6-bit number in sign-magnitude representation, $x_5x_4x_3x_2x_1x_0$, where $x_5$ represents the sign, and bits $x_4x_3x_2x_1x_0$ represent the magnitude of the sample: bits $x_4x_3$ form the integer part and bits $x_2x_1x_0$ the fractional part. Thus the samples are in the range of $-3\,7/8$ to $+3\,7/8$. The digital network that calculates the metrics can be implemented by separating the calculations based on bits $x_4x_3$. This is illustrated in FIG. 9 and Table 38.

TABLE 38

Branch metrics unit implementation.

| Branch Metric Unit | $X_4X_3$ | One-step branch metric |
|---|---|---|
| +3/−3 | 11 | $0x_2x_1x_0$ |
|       | 10 | $0\overline{x_2x_1x_0}$ + 0001 |
|       | 01 | $1x_2x_1x_0$ + 0001 |
|       | 00 | 1111 |
| +2/−2 | 11 | $1x_2x_1x_0$ |
|       | 10 | $0x_2x_1x_0$ |
|       | 01 | $0\overline{x_2x_1x_0}$ + 0001 |
|       | 00 | $1\overline{x_2x_1x_0}$ + 0001 |
| +1/−1 | 11 | 1111 |
|       | 10 | $1x_2x_1x_0$ |
|       | 01 | $0x_2x_1x_0$ |
|       | 00 | $0\overline{x_2x_1x_0}$ + 0001 |
| 0     | 11 | 1111 |
|       | 10 | 1111 |
|       | 01 | $1x_2x_1x_0$ |
|       | 00 | $0x_2x_1x_0$ |
| −1/+1 | 11 | 1111 |
|       | 10 | 1111 |
|       | 01 | 1111 |
|       | 00 | $1x_2x_1x_0$ |

Note that the one-step branch metric saturates at $1\,7/8$. The table can be rearranged to show the possibilities of implementation, based on $x_4x_3$, as shown in Table 39.

TABLE 39

The branch metrics units
implementation with respect to input samples.

| x4x3 | Branch Metric Unit | One-step branch metric |
|---|---|---|
| 11 | +3/−3 | $0x_2x_1x_0$ |
|    | +2/−2 | $1x_2x_1x_0$ |
|    | +1/−1 | 1111 |
|    | 0     | 1111 |
|    | −1/+1 | 1111 |
| 10 | +3/−3 | $0\overline{x_2x_1x_0}$ + 0001 |
|    | +2/−2 | $0x_2x_1x_0$ |
|    | +1/−1 | $1x_2x_1x_0$ |
|    | 0     | 1111 |
|    | −1/+1 | 1111 |
| 01 | +3/−3 | $1\overline{x_2x_1x_0}$ + 0001 |
|    | +2/−2 | $0\overline{x_2x_1x_0}$ + 0001 |
|    | +1/−1 | $0x_2x_1x_0$ |
|    | 0     | $1x_2x_1x_0$ |
|    | −1/+1 | 1111 |

TABLE 39-continued

The branch metrics units
implementation with respect to input samples.

| x4x3 | Branch Metric Unit | One-step branch metric |
|---|---|---|
| 00 | +3/−3 | 1111 |
|  | +2/−2 | $1\overline{x_2x_1x_0}$ + 0001 |
|  | +1/−1 | $0\overline{x_2x_1x_0}$ |
|  | 0 | $0x_2x_1x_0$ |
|  | −1/+1 | $1x_2x_1x_0$ |

The five one-step branch metric computations are simply implemented. The three fraction bits of each metric are calculated as $bm^i=k_1+(k_0 \oplus x_i)$, for i=0,1,2 (the symbol $\oplus$ means addition modulo 2), where $k_1$ and $k_0$ are bits that depend on $x_4$ and $x_3$ as listed in the following. Also, the integer bit $bm_3$ depends on $x_4x_3$, as listed.

BMU+3/−3:
$bm_{+3,3}=\overline{x_4}$;
$k_{+3,1}=\overline{(x_4+x_3)}$;
$k_{+3,0}=x_4 \oplus x_3$
BMU +2/−2:
$bm_{+2,3}=\overline{x_4 \oplus x_3}$;
$k_{+2,1}=0$;
$k_{+2,0}=\overline{x_4}$
BMU +1/−1:
$bm_{+1,3}=x_4$;
$k_{+1,1}=x_4x_3$;
$k_{+1,0}=\overline{x_3+x_4}$.
BMU 0:
$bm_{0,3}=x_4+x_3$;
$k_{0,1}=x_4$;
$k_{0,0}=0$.
BMU −1/+1:
$bm_{-1,3}=1$;
$k_{-1,1}=(x_4+x_3)$;
$k_{-1,)}=0$.

The two-step branch metric is obtained by adding two successive one-step branch metrics resulting in a 5-bit value (range 0 to +3 7/8). A 4-bit adder is needed for the implementation. When the sample is less than the target (i.e., using the complements $x_2x_1x_0$) the result is inaccurate, since the result is not exactly the complement; 0001 must be added for the proper result as indicated the tables 38–39. This addition of 0001 appears in the final adder as a carry-in. If both inputs have a carry-in, one of them is ignored (e.g., an OR gate). The loss in performance is (should be) negligible.

ACS Units Assignment

Figure 10:
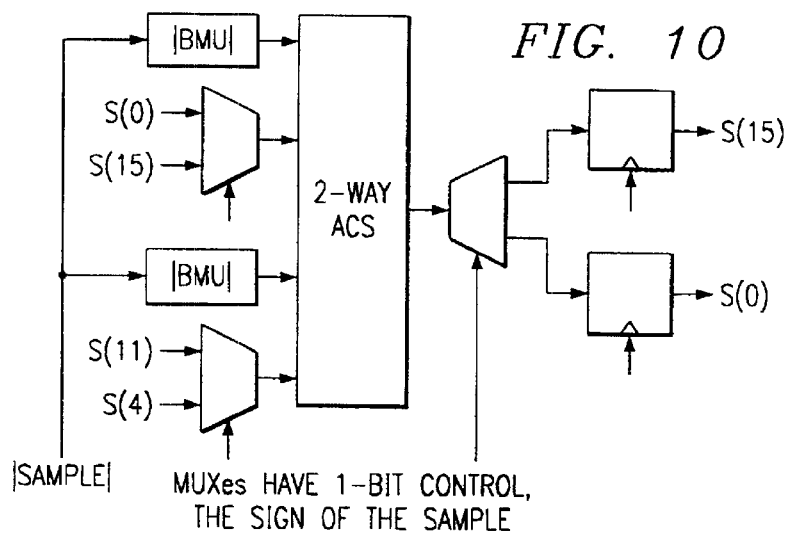
FIGS. 10–11 illustrate ACS sharing.

As previously described, ACS units are shared between two states. For example, states 0 and 15 share two units, one 4-way and one 2-way and states 7 and 8 share only one 3-way unit. An example is shown in FIG. 10. The two-way ACS unit 15/0 updates states 15 or 0, depending on input sample polarity. When state 0 is calculated, the current state metrics for states 0 and 8 should be added to corresponding branch metrics, and when state 15 is updated, state metrics for states 15 and 7 are added to the branch metrics that have the same absolute value. In both cases the results are then compared and the smaller is selected as a new state metric. The new state metric is then written to the register that carries the calculated state, either state 0 or 15.

Figure 11:
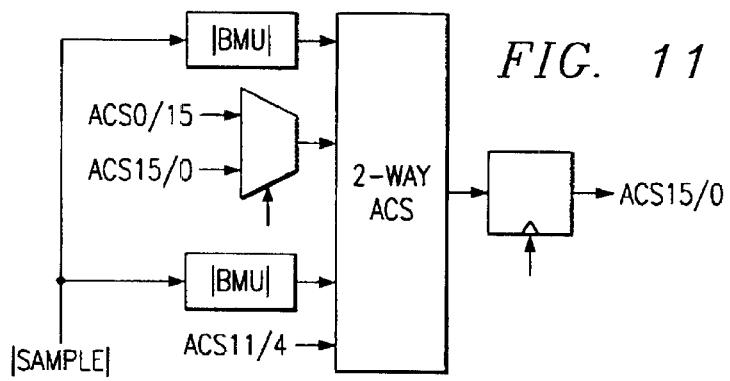

This implementation requires 2 2-way MUXes at the input and one 2-way DMUX at the output, that are in critical path and limit the maximum operating frequency. The DMUX can be eliminated from the design which will involve slightly more complicated control of the input MUXes, as shown in FIG. 11.

The Control of Multiplexers

If the signs of the samples are labeled with s3 for the sign of x(prior), s2 for the sign of x(current1), s1 for the sign of x(current2), and s0 for the sign of x(next); then set sn=0 if x<0, sn=1 if x>0. This yields ACS 0/15 calculates state 0 if s3=0 and state 15 if s3=1, ACS 15/0 calculates state 15 if s3=0 and state 0 if s3=1, etc., as illustrated in Table 40.

TABLE 40

Control scheme for ACS sharing.

| ACS | state | control |
|---|---|---|
| 0/15 | 0 | s3 = 0 |
| 15/0 | 15 | s3 = 0 |
| 1/14 | 1 | s0 = 1 |
| 2/13 | 2 | s3 = 0 |
| 13/2 | 13 | s3 = 0 |
| 3/12 | 3 | s0 = 1 |
| 4/11 | 4 | s1 = 1 |
| 11/4 | 11 | s1 = 1 |
| 6/9 | 6 | s2 = 1 |
| 9/6 | 9 | s2 = 1 |
| 7/8 | 7 | s2 = 1 |

The Elimination of DMUX with New Control

In the preferred embodiment with only MUXes, the control is more complicated, and more than one signal is required to control all the inputs. Except the DMUXes, some of the MUXes are also eliminated from the inputs (in case when 1/14, 3/12 or 7/8 was taken to the input). Table 41 shows the control in terms of s0–s3 and the righthand column also indicates in parenthesis which state the ACS unit is assigned to.

TABLE 41

ACS sharing, controls signals

| ACS | Input | Control (state) |
|---|---|---|
| 0/15 | 0/15 | s4 = 0, s3 = 0(0) |
|  |  | s4 = 1, s3 = 1(15) |
|  | 15/0 | s4 = 1, s3 = 0(0) |
|  |  | s4 = 0, s3 = 1(15) |
|  | 4/11 | s3 = 1, s3 = 0(0)!! |
|  |  | s3 = 0, s3 = 1(15)! |
|  | 11/4 | s3 = 0, s3 = 0(0) |
|  |  | s3 = 1, s3 = 1(15) |
|  | 8/7 | 1 |
|  | 12/3 | 1 |
| 15/0 | 0/15 | s4 = 1, s3 = 0(15) |
|  |  | s4 = 0, s3 = 1(0) |
|  | 15/0 | s4 = 0, s3 = 0(15) |
|  |  | s4 = 1, s3 = 1(0) |
|  | 4/11 | s3 = 0, s3 = 0(15) |
|  |  | s3 = 1, s3 = 1(0) |
|  | 11/4 | s3 = 1, s3 = 0(15) |
|  |  | s3 = 0, s3 = 1(0) |
| 1/14 | 0/15 | s4 = 0, s0 = 1(1) |
|  |  | s4 = 1, s0 = 0(14) |
|  | 15/0 | s4 = 1, s0 = 1(1) |
|  |  | s4 = 0, s0 = 0(14) |
|  | 4/11 | s3 = 1, s0 = 1(1) |
|  |  | s3 = 0, s0 = 0(14) |
|  | 11/4 | s3 = 0, s0 = 1(1) |
|  |  | s3 = 1, s0 = 0(14) |

TABLE 41-continued

ACS sharing, controls signals

| ACS | Input | Control (state) |
|---|---|---|
|  | 8/7 | 1 |
|  | 12/3 | 1 |
| 2/13 | 0/15 | s4 = 0, s3 = 0(2) |
|  |  | s4 = 1, s3 = 1(13) |
|  | 15/0 | s4 = 1, s3 = 0(2) |
|  |  | s4 = 0, s3 = 1(13) |
|  | 4/11 | s3 = 1, s3 = 0(2)!! |
|  |  | s3 = 0, s3 = 1(13)! |
|  | 11/4 | s3 = 0, s3 = 0(2) |
|  |  | s3 = 1, s3 = 1(13) |
|  | 8/7 | 1 |
|  | 12/3 | 1 |
| 13/2 | 0/15 | s4 = 1, s3 = 0(13) |
|  |  | s4 = 0, s3 = 1(2) |
|  | 15/0 | s4 = 0, s3 = 0(13) |
|  |  | s4 = 1, s3 = 1(2) |
|  | 4/11 | s3 = 0, s3 = 0(13) |
|  |  | s3 = 1, s3 = 1(2) |
|  | 11/4 | s3 = 1, s3 = 0(13) |
|  |  | s3 = 0, s3 = 1(2) |
| 3/12 | 0/15 | s4 = 0, s0 = 1(3) |
|  |  | s4 = 1, s0 = 0(12) |
|  | 15/0 | s4 = 1, s0 = 1(3) |
|  |  | s4 = 0, s0 = 0(12) |
|  | 4/11 | s3 = 1, s0 = 1(3) |
|  |  | s3 = 0, s0 = 0(12) |
|  | 11/4 | s3 = 0, s0 = 1(3) |
|  |  | s3 = 1, s0 = 0(12) |
|  | 8/7 | 1 |
|  | 12/3 | 1 |
| 4/11 | 1/14 | s2 = 1, s2 = 1(4) |
|  |  | s2 = 0, s2 = 0(11) |
|  | 9/6 | s2 = 1, s2 = 1(4) |
|  |  | s2 = 0, s2 = 0(11) |
|  | 6/9 | s2 = 0, s2 = 1(4) |
|  |  | s2 = 1, s2 = 0(11) |
|  | 13/2 | s4 = 0, s2 = 1(4) |
|  |  | s4 = 1, s2 = 0(11) |
|  | 2/13 | s4 = 1, s2 = 1(4) |
|  |  | s4 = 0, s2 = 0(11) |
| 11/4 | 9/6 | s2 = 0, s2 = 1(11) |
|  |  | s2 = 1, s2 = 0(4) |
|  | 6/9 | s2 = 1, s2 = 1(11) |
|  |  | s2 = 0, s2 = 0(4) |
|  | 13/2 | s4 = 1, s2 = 1(11) |
|  |  | s4 = 0, s2 = 0(4) |
|  | 2/13 | s4 = 0, s2 = 1(11) |
|  |  | s4 = 1, s2 = 0(4) |
| 6/9 | 1/14 | s2 = 1, s1 = 1(6) |
|  |  | s2 = 0, s1 = 0(9) |
|  | 9/6 | s2 = 1, s1 = 1(6) |
|  |  | s2 = 0, s1 = 0(9) |
|  | 6/9 | s2 = 0, s1 = 1(6) |
|  |  | s2 = 1, s1 = 0(9) |
|  | 13/2 | s4 = 0, s1 = 1(6) |
|  |  | s4 = 1, s1 = 0(9) |
|  | 2/13 | s4 = 1, s1 = 1(6) |
|  |  | s4 = 0, s1 = 0(9) |
| 9/6 | 2/13 | s4 = 0, s1 = 1(9) |
|  |  | s4 = 1, s1 = 0(6) |
|  | 13/2 | s4 = 1, s1 = 1(9) |
|  |  | s4 = 0, s1 = 0(6) |
| 7/8 | 1/14 | s2 = 1, s2 = 1(7) |
|  |  | s2 = 0, s2 = 0(8) |
|  | 9/6 | s2 = 1, s1 = 1(7) |
|  |  | s2 = 0, s1 = 0(8) |
|  | 6/9 | s2 = 0, s1 = 1(7) |
|  |  | s2 = 1, s1 = 0(8) |
|  | 13/2 | s4 = 0, s1 = 1(7) |
|  |  | s4 = 1, s1 = 0(8) |
|  | 2/13 | s4 = 1, s1 = 1(7) |
|  |  | s4 = 0, s1 = 0(8) |

The inputs 1/14, 3/12 and 7/8 have to be marked as invalid when they carry invalid information. Those are:

1/14 in sequences (1) −−+−, −−++, +−+−, +−++;
  Control: s2=0, s1=1 on ACSs 6/9 and 7/8

(14) −+−−, −+−+, ++−−, ++−+;
  Control: s2=1 and s1=0 on ACSs 6/9 and 7/8

Together: s2⊕s1

3/12 in sequences:

| | | |
|---|---|---|
| − − − − | 3 in states 12, 14 | |
| − − − + | | |
| − − + − | 3 in states 12, 14 | |
| − − + + | | |
| − + − − | 3 in states 12, 14 | 12 in states 0, 2 |
| − + − + | | |
| − + + − | 3 in states 12, 14 | 12 in states 0, 1, 2, 3 |
| − + + + | | 12 in states 0, 2 |
| + − − − | 3 in states 12, 13, 14, 15 | |
| + − − + | 3 in states 13, 15 | 12 in states 1, 3 |
| + − + − | 3 in states 12, 13, 14, 15 | |
| + − + + | 3 in states 13, 15 | 12 in states 1, 3 |
| + + − − | | |
| + + − + | | 12 in states 1, 3 |
| + + + − | | |
| + + + + | | 12 in states 1, 3 |

Control logic: for all the ACSs (0/15, 1/14, 2/13, 3/12): s3⊕s2 for ACSs 1/14, 3/12 additionally s3s0+s̄3s̄0

7/8 in sequences:

| | | |
|---|---|---|
| − − − − | 7 in states 12, 14 | |
| − − − + | | |
| − − + − | 7 in states 12, 14 | |
| − − + + | | |
| − + − − | 7 in states 12, 14 | 12 in states 0, 2 |
| − + − + | | |
| − + + − | 7 in states 12, 14 | |
| − + + + | | |
| + − − − | | |
| + − − + | 8 in states 1, 3 | |
| + − + − | | |
| + − + + | 8 in states 1, 3 | |
| + + − − | | |
| + + − + | 8 in states 1, 3 | |
| + + + − | | |
| + + + + | 8 in states 1, 3 | |

Survival Register Design

Using the same approach the complexity of the survival path in register-exchange implementation can be reduced.

In full radix-4 trellis it is implemented as pairs of memory elements, connected with 4-way MUXes.

The complexity can be reduced by associating survival registers to ACSes instead of associating to states. In this case, 11 survival registers would be needed, with MUXes as shown in Table 42.

TABLE 42

Survival register implementation.

| SR | MUX |
|---|---|
| 0/15 | 6-way (0/15, 15/0, 4/11, 11/4, 7/8, 3/12) |
| 15/0 | 4-way (0/15, 15/0, 4/11, 11/4) |
| 1/14 | 6-way (0/15, 15/0, 4/11, 11/4, 7/8, 3/12) |
| 2/13 | 6-way (0/15, 15/0, 4/11, 11/4, 7/8, 3/12) |
| 13/2 | 4-way (0/15, 15/0, 4/11, 11/4) |
| 3/12 | 6-way (0/15, 15/0, 4/11, 11/4, 7/8, 3/12) |
| 4/11 | 5-way (1/14, 6/9, 9/6, 2/13, 13/2) |

TABLE 42-continued

Survival register implementation.

| SR | MUX |
|---|---|
| 11/4 | 4-way (6/9, 9/6, 2/13, 13/2) |
| 6/9 | 5-way (1/14, 6/9, 9/6, 2/13, 13/2) |
| 9/6 | 2-way (2/13, 13/2) |
| 7/8 | 5-way (1/14, 6/9, 9/6, 2/13, 13/2) |

Modifications of the First Preferred Embodiment

The foregoing preferred embodiment used classification of samples as positive or negative and predetected with sequences of four samples (prior, current1, current2, and next) to have 16 possible cases as illustrated in FIGS. 5a–5p and a maximum of 11 two-step trellis states (or 13 states if the modulation code failed to eliminate states 0101 and 1010). An alternative is to predetect only sequences of three samples (prior, current1, current2 or current1, current2, and next); this reduces the number of cases to 8, but increases the number of two-step trellis states and ACS units by 1 up to 12. In effect, this would merge pairs of FIGS. 5a–5p and simplify the switching at the cost of another ACS unit.

Performance Evaluation

Figure 12:
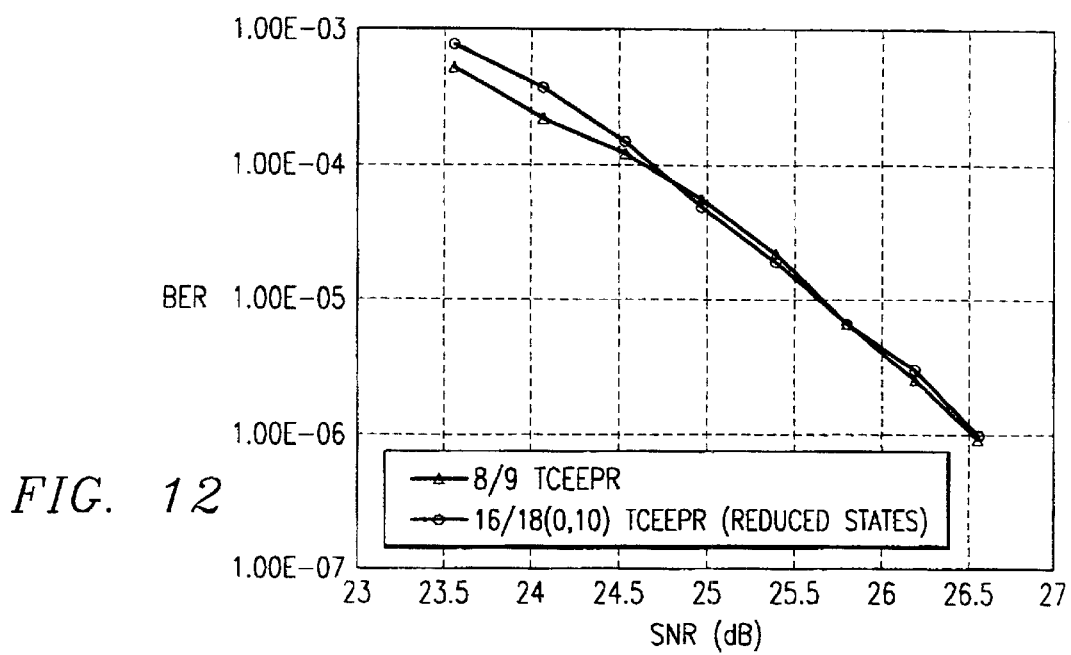
FIG. 12 presents experimental results.

The preferred embodiment reduced complexity $E^2PR4$ sequence detection algorithm is compared with a full trellis implementation. To have a fair comparison, the same trellis code was used, which eliminates two states in two-step implementation. The bit-error rate (BER) vs. signal-to-noise ratio (SNR) performance is shown in FIG. 12.

It can be seen that there is no performance degradation at SNRs above 26 dB, and that there is small loss for lower SNRs.

The complexity of the preferred embodiment implementation is significantly reduced, as illustrated in Table 43. The major reduction in complexity is in ACS units, which is the Viterbi algorithm's speed bottleneck with highest power dissipation. The area/size savings are over 50%, comparing to full 16-state implementation, or about 30% comparing to full trellis-coded approach.

TABLE 43

Building blocks complexity estimation.

| | 16-state Radix4 | 14-state Radix4 | Reduced Complex |
|---|---|---|---|
| Branch Metrics Unit | | | |
| Single St. Metrics | 14 | 14 | 10 |
| Adders | 39 | 39 | 25 |
| Add-Compare-Select Unit | | | |
| 4-way | 16 | 8 | 4 |
| 3-way | 0 | 6 | 3 |
| 2-way | 0 | 0 | 3 |
| 1-way | 0 | 0 | 1 |
| Adders | 64 | 50 | 32 |
| Subtractors | 96 | 57 | 36 |
| Survival Path Decode | | | |
| Flip-flops | 192 | 168 | 132 |

What is claimed is:

1. A method of Viterbi detection, comprising:

(a) classify input samples into classes corresponding to sample values;

(b) for each of said classes, eliminate at least one possible target sample value;

(c) sort sequences of m+2 samples into sets according to the class of each member of the sequence where m is a positive integer, an m-step trellis is being used, the m+2 samples correspond to the m current samples, the immediately prior sample, and the next sample, and the number of said sets equals $C^{m+2}$ where C is the number of classes from step (a)

(d) use a number of add-compare-select units equal to the maximum number of m-step trellis input states or output states for any of said sets; and (e) switch state metric outputs and inputs among said add-compare-select units whereby less than all possible state metrics are maintained.

2. The method of detection of claim 1, wherein:

(a) said classes consists of a first class and a second class with a sample in said first class if the sample value is non-negative and in said second class if the sample value is negative; and (b) prior to said classifying of step (a) of claim 1, when the target values for a sample are −N, . . . , −1, 0, +1, . . . , +N where N is a positive integer, said step (b) of claim 1 eliminates −N for said first class and eliminates +N for said second class.

3. The method of claim 2, wherein:

(a) m equals 2;

(b) the samples correspond to partial response channel pulses of type EEPR4;

(c) the samples derive from coded inputs which preclude 2-step trellis states 0101 and 1010; and (d) the sample target values are −3, −2, −1, 0, +1, +2, and +3, and the target values for samples in said first class are −1, 0, +1, +2, and +3, and the target values for samples in said second class are −3, −2, −1, 0, and +1.

4. A Viterbi detector, comprising:

(a) a data input for samples of an EEPR4 type and coded to preclude states 0101 and 1010 in every second trellis step;

(b) eleven add-compare-select units: four units with four state metric inputs, three units with three state metric inputs, three units with two state metric inputs, and one unit with one state metric input;

(c) branch metric units with inputs coupled to said data input and said add-compare-select outputs and with outputs coupled to inputs of said add-compare-select units; and (d) survival registers coupled to the outputs of said add-compare-select units.

* * * * *